United States Patent
Meller et al.

(10) Patent No.: US 11,165,447 B2
(45) Date of Patent: Nov. 2, 2021

(54) GCC DECODING AND POLAR CODE SUCCESSIVE-CANCELLATION LIST DECODING WITH DECOMPOSITION INTO CONCATENATED INNER AND OUTER CODES

(71) Applicant: TSOFUN ALGORITHMS LTD., Tel Aviv (IL)

(72) Inventors: Eldad Meller, Even Yehuda (IL); Noam Presman, Givatayim (IL); Alexander Smekhov, Tel Aviv (IL); Nissim Halabi, Ramat-Gan (IL)

(73) Assignee: TSOFUN ALGORITHMS LTD., Tel Aviv (IL)

( * ) Notice: Subject to any disclaimer, the term of this patent is extended or adjusted under 35 U.S.C. 154(b) by 0 days.

(21) Appl. No.: 16/642,438

(22) PCT Filed: Apr. 10, 2018

(86) PCT No.: PCT/IL2018/050414
§ 371 (c)(1),
(2) Date: Feb. 27, 2020

(87) PCT Pub. No.: WO2019/043680
PCT Pub. Date: Mar. 7, 2019

(65) Prior Publication Data
US 2020/0259510 A1    Aug. 13, 2020

Related U.S. Application Data

(60) Provisional application No. 62/553,864, filed on Sep. 3, 2017.

(51) Int. Cl.
*H03M 13/45*   (2006.01)
*H03M 13/29*   (2006.01)

(52) U.S. Cl.
CPC ..... *H03M 13/458* (2013.01); *H03M 13/2906* (2013.01)

(58) Field of Classification Search
CPC . H03M 13/458; H03M 13/2906; H03M 13/39
(Continued)

(56) References Cited

U.S. PATENT DOCUMENTS

2018/0219561 A1\* 8/2018 Litsyn ............... H03M 13/2948
2018/0351581 A1\* 12/2018 Presman ............... H04L 1/0057
(Continued)

OTHER PUBLICATIONS

Giard, Pascal; Balatsoukas-Stimming, Alexios: Fast Low-Complexity Decoders for Low-Rate Polar Codes Journal of Signal Processing Systems, May 2018, vol. 90(5), p. 675-685 (Year: 2018).\*

(Continued)

*Primary Examiner* — Fritz Alphonse
(74) *Attorney, Agent, or Firm* — Browdy and Neimark, PLLC

(57) ABSTRACT

There is provided a method of sequential list decoding of an error correction code (ECC) utilizing a decoder comprising a plurality of processors. The method comprises: a) obtaining an ordered sequence of constituent codes usable for the sequential decoding of the ECC; b) executing, by a first processor, a task of decoding a first constituent code, the executing comprising: a. generating decoding candidate words (DCWs) usable to be selected for decoding a subsequent constituent code, each DCW associated with a ranking; b. for the first constituent code, upon occurrence of a sufficiency criterion, and prior to completion of the generating all DCWs and rankings, selecting, in accordance with a selection criterion, at least one DCW; c) executing, by a second processor, a task of decoding a subsequent constituent code, the executing comprising processing data derived (Continued)

from the selected DCWs to generate data usable for decoding a next subsequent constituent code.

30 Claims, 11 Drawing Sheets

(58) Field of Classification Search
USPC .......................................... 714/755, 754, 760
See application file for complete search history.

(56) References Cited

U.S. PATENT DOCUMENTS

2019/0108093 A1* 4/2019 Presman ................ G11C 29/52
2019/0229844 A1* 7/2019 Coulombe ........ H03M 13/3761

OTHER PUBLICATIONS

Blokh, È. L., & Zyablov, V. V. (1974). Coding of generalized concatenated codes. Problemy Peredachi Informatsii, 10(3), 45-50.
Zinov'ev, V. A. (1976). Generalized cascade codes. Problemy Peredachi Informatsii, 12(1), 5-15.
Forney, G. D. (1965). Concatenated codes. Technical Report 440, Massachusetts Institute of Technology Research Laboratory of Electronics, Dec. 1, 1965.
Dumer, I. I. (1998). Concatenated codes and their multilevel generalizations. Handbook of coding theory.
Arikan, E. (2009). Channel polarization: A method for constructing capacity-achieving codes for symmetric binary-input memoryless channels. IEEE Transactions on information Theory, 55(7), 3051-3073.
Presman, N., & Litsyn, S. (2017). Recursive descriptions of polar codes. Advances in Mathematics of Communications 11(1), 1.
Tai, L, & Vardy, A. (2015). List decoding of polar codes. IEEE Transactions on Information Theory, 61(5), 2213-2226.
Hashemi, S. A., Condo, C., & Gross, W. J. (Mar. 2017). Fast simplified successive-cancellation list decoding of polar codes. In 2017 IEEE Wireless Communications and Networking Conference Workshops (WCNCW) (pp. 1-6). IEEE.
Sarkis, G., Giard, P., Vardy, A., Thibeault, C., & Gross, W. J. (2015). Fast list decoders for polar codes. IEEE Journal on Selected Areas in Communications, 34(2), 318-328.
Giard, P., Sarkis, G., Balatsoukas-Stimming, A., Fan, Y., Tsui, C. Y., Burg, A., . . . & Gross, W. J. (May 2016). Hardware decoders for polar codes: An overview. In 2016 IEEE International Symposium on Circuits and Systems (ISCAS) (pp. 149-152). Ieee.
Kschischang, F. R., Frey, B. J., & Loeliger, H. A. (2001). Factor graphs and the sum-product algorithm. IEEE Transactions on information theory, 47(2), 498-519.
Forney, G. D. (2014). Codes on graphs: Fundamentals. IEEE Transactions on Information Theory, 60(10), 5809-5826.
Ferris, A. J., Hirche, C., & Poulin, D. (2017). Convolutional polar codes. arXiv preprint arXiv:1704.00715.
Ferris, A. J., & Poulin, D. (Jun. 2014). Branching MERA codes: A natural extension of classical and quantum polar codes. In 2014 IEEE International Symposium on Information Theory (pp. 1081-1085) IEEE.
Balatsoukas-Stimming, A., Parizi, M. B., & Burg, A. (2015). LLR-based successive cancellation list decoding of polar codes. IEEE transactions on signal processing, 63(19), 5165-5179.
Li Bin Et al: "Low-latency polar codes via hybrid decoding", 2014 8th international symposiuh on turbo codes and terative inforhation processing (ISTC), IEEE, Aug. 18, 2014 (Aug. 18, 2014), pp. 223-227, XP032682416, DOI 10.1109/ISTC.2014.6955118 [retrieved on Nov. 12, 2014].
Seshadri n et al.: "list viterbi decoding algorithms with applications", ieee transactions on communications, ieee service center, piscataway, nj. usa, vol. 42, No. 2/03/04, Feb. 1994 (Feb. 1994), pp. 313-322, XP000445945, ISSN: 0090-6778, DOI: 10.1109/TCOMM. 1994.577040 Section 2.2, "Parallei LVA".
Youzhe Fan et al.: "Low-latency List Decoding of Polar Codes With Double Thresholding", arxiv.org, Cornell University Library, 201 Olin Library Cornell University Ithaca, NY 14853, Apr. 14, 2015 (Apr. 14, 2015), XP080801482, DOI: 10.1109/ICASSP.2015. 7178128 t.
Chen Ji et al.: "Low-Complexity List Successive-Cancellation Decoding of Polar Codes Using List Pruning", 2016 IEEE Global Communications Conference (GLOBECOM), IEEE, Dec. 4, 2016 (Dec. 4, 2016), pp. 1-6, XP033058693, DOI: 10.1109/GLOCOM. 2016.7841969 [retrieved on Feb. 2, 2017].
Liang Xiao et al.: "Hardware Efficient and Low-Latency CA-SCL Decoder Based on Distributed Sorting", 2016 IEEE Global Communications Conference (GLOBECOM), IEEE, Dec. 4, 2016 (Dec. 4, 2016), pp. 1-6, XP033058589, DOI: 10.1109/GLOCOM.2016. 7841865 [retrieved on Feb. 2, 2017] Section III.A.
Noam Presman et al: "Recursive descriptions of polar codes", Advances in Mathematics of Communication, vol. 11, No. 1, Jun. 18, 2015 (Jun. 18, 2015), pp. 1-65, XP055491282, US ISSN: 1930-5346, DOI 10.3934/amc.2017001 Section 4 "Recursive Descriptions of Polar Codes Decoding Algorithm".

* cited by examiner

| Time (CC) | 0 | 1 | 2 | 3 | 4 | 5 | 6 | 7 | 8 | 9 | 10 |
|---|---|---|---|---|---|---|---|---|---|---|---|
| Subset A | C; s=0; j=0; | C; s=0; j=1; | C; s=0; j=2; | C; s=0; j=3; | | | | | | | |
| Subset B | | (1,0); s=0; j=0; | (1,0); s=0; j=1; | (1,0); s=0; j=2; | (1,0); s=0; j=3; | | | | | | |
| Subset C | | | (2,0); s=0; j=0; | (2,0); s=0; j=1; | (2,0); s=0; j=2; | (2,0); s=0; j=3; | (2,0); s=1; j=0; | (2,0); s=1; j=1; | (2,0); s=1; j=2; | (2,0); s=1; j=3; | |
| Candidates Generator | | | | (3,0); j=0; | (3,0); j=1; | (3,0); j=2; | (3,0); j=3; | (3,1); j=0; | (3,1); j=1; | (3,1); j=2; | (3,1); j=3; |
| Selector | | | | | | (3,0); j=0; | (3,0); j=1; | (3,0); j=2; | (3,0); j=3; | (3,1); j=0; | (3,1); j=1; |

FIG. 10

| Polar Code | | | | | |
|---|---|---|---|---|---|
| Info Payload length (K) [bits] | | 200 | 600 | 600 | 1000 |
| Code Rate | | 1/6 | 1/3 | 1/6 | 1/6 |
| Codeword length (N) [bits] | | 1200 | 1800 | 3600 | 6000 |
| SCL Decoder Latency (μs) | List 8 | 3.32 | 7.00 | 8.72 | 16.32 |
| | List 8 NPE=32 | 2.48 | 5.59 | 6.52 | 11.59 |
| | List 8 NPE=64 | 2.37 | 4.13 | 5.93 | 11.46 |
| SSCL Decoder Latency (μs) | List 8 NPE=32 | 1.54 | 2.79 | 3.77 | 6.92 |
| | List 8 NPE=64 | 1.67 | 2.85 | 4.24 | 8.44 |
| SSCL Latency with Sequential Processing Selector (μs) | List 8 NPE=64 | 0.98 | 1.71 | 2.44 | 4.67 |

FIG. 11

GCC DECODING AND POLAR CODE SUCCESSIVE-CANCELLATION LIST DECODING WITH DECOMPOSITION INTO CONCATENATED INNER AND OUTER CODES

CROSS-REFERENCES TO RELATED APPLICATIONS

The present application claims benefit from U.S. Provisional Patent Application No. 62/553,864 filed on Sep. 3, 2017, the application being hereby incorporated by reference in its entirety.

TECHNICAL HELD

The presently disclosed subject matter relates to error correction codes (ECCs) and, more particularly, to decoding systems for such codes.

BACKGROUND

Problems of the decoding of error correction codes have been recognized in conventional art and various techniques have been developed to provide solutions, example:

Generalized Concatenated Codes (GCC) are error correcting codes that are constructed by a technique which was introduced by Blokh and Zyabolov (Blokh, E. & Zyabolov, V. "Coding of Generalized Concatenated Codes", Probl. Peredachi Inform., 1974, 10, 45-50) and Zinoviev (Zinoviev, V., "Generalized Concatenated Codes", Probl. Peredachi Inform., 1976, 12, 5-15). The construction of the GCCs is a generalization of Forney's code concatenation method (Forney G. D. J., "Concatenated Codes", Cambridge, Mass.: M.I.T. Press, 1966). A good survey on GCCs was authored by I. Dumer (I. Dumer, "Concatenated Codes and Their Multilevel Generalizations", Handbook of Coding Theory, V. S. Pless & W. C. Huffman (Eds.), Elsevier, The Netherlands, 1998).

Polar codes were introduced by Arikan (E. Arikan, "Channel polarization: A method for constructing capacity-achieving codes for symmetric binary-input memoryless channels"). Generalizations of polar codes and their decoding algorithms followed (see e.g. Presman and Litsyn, "Recursive descriptions of polar codes". Adv. in Math. of Comm 11(1): 1-65 (2017)). A sequential list decoding algorithm for polar codes called successive cancellation list (SCL) was proposed by Tal and Vardy (Ido Tal and Alexander Vardy, "List Decoding of Polar Codes", IEEE Trans. Information Theory 61(5): 2213-2226 (2015)).

System and hardware architectures for such decoders have also been proposed (see e.g. Seyyed Ali Hashemi, Carlo Condo and Warren J. Gross, "Fast Simplified Successive-Cancellation List Decoding of Polar Codes". CoRR abs/1701.08126 (2017)); Gabi Sarkis, Pascal Giard, Alexander Vardy, Claude Thibeault and Warren J. Gross, "Fast List Decoders for Polar Codes", IEEE Journal on Selected Areas in Communications 34(2): 318-328 (2016); Pascal Giard, Gabi Sarkis, Alexios Balatsoukas-Stimming YouZhe Fan, Chi-Ying Tsui, Andreas Peter Burg, Claude Thibeault, Warren J. Gross, "Hardware decoders for polar codes: An overview", ISCAS 2016: 149-152).

There are other error correction codes which may be represented by graphical models (e.g. factor-graphs, normal factor-graphs or tensor-networks etc.). Information on factor graphs may be found in the following papers and references:

F. R. Kschischang B. J. Frey H.-A. Loeliger "Factor graphs and the sum-product algorithm," in IEEE Transactions on Information Theory, vol. 47 no. 2 pp. 498-519 February 2001

G. D. Forney, "Codes on Graphs: Fundamentals," in IEEE Transactions on Information Theory, vol. 60, no. 10, pp. 5809-5826, October 2014.

Recently, codes based on Tensor networks, called Multiscale Entanglement Renormalization Ansatz (MERA) codes, were introduced. An interesting member of this family is convolutional polar code.

Reference is made to the following two references:

Andrew James Ferris, Christoph Hirche, David Poulin, "Convolutional Polar Codes", CoRR abs/1704.00715 (2017)

and

Andrew James Ferris, David Poulin, "Branching MERA codes: A natural extension of classical and quantum polar codes". ISIT 2014: 1081-1085

The references cited above teach background information that may be applicable to the presently disclosed subject matter. Therefore the full contents of these publications are incorporated by reference herein where appropriate for appropriate teachings of additional or alternative details, features and/or technical background.

GENERAL DESCRIPTION

According to one aspect of the presently disclosed subject matter there is provided a computer implemented method of sequential list decoding of a codeword of an error correction code, the method provided by a decoder comprising a plurality of processors, the method comprising:

a) obtaining, by the decoder, an ordered sequence of constituent codes usable for sequential decoding of the error correction code;

b) executing by a first processor of the plurality of processors a task of decoding a first constituent code, the executing comprising:
  a. generating a set of one or more decoding candidate words (DCWs) usable to be selected for decoding a subsequent constituent code, each DCW associated with a respectively generated ranking;
  b. for the first constituent code, upon occurrence of a sufficiency criterion, and prior to completion by the first processor of the generating all DCWs and respectively associated rankings, selecting, in accordance with a selection criterion, at least one DCW, thereby giving rise to one or more selected DCWs;

c) executing by a second processor of the plurality of processors a task of decoding a subsequent constituent code, the executing comprising processing data derived from the one or more selected DCWs to generate data usable for decoding a next subsequent constituent code.

In addition to the above features, the method according to this aspect of the presently disclosed subject matter can comprise one or more of features (i) to (xxii) listed below, in any desired combination or permutation which is technically possible:

i. repeating the operations b) and c) until a completion criterion is met.

ii. the first processor and the second processor are the same processor.

iii. the second processor executes at least part of the task of decoding of the second subsequent constituent code concurrently with executing the task of decoding of the first constituent code by the first processor.

iv. the completion criterion occurs when all DCWs and respectively associated rankings have been generated.
v. the sufficiency criterion occurs when a count of generated DCWs and rankings thereof meets a generated DCW threshold.
vi. the sufficiency criterion occurs when a count of generated CWs with associated rankings meeting a ranking threshold meets a high ranking DCW count threshold.
vii. the sufficiency criterion occurs when a count of input models for which all DCWs and rankings thereof have been generated meets an input threshold.
viii. a ranking is associated with an input model, and wherein the generating of DCWs with respectively associated rankings from input models is ordered according to the rankings associated with the input models.
ix. the selecting comprises utilizing a threshold number of DCWs to be selected and, upon the generating of a DCW with a ranking exceeding the ranking of a given number of already selected DCWs, selecting a number of DCWs larger than the threshold.
x. the data derived from the one or more selected DCWs comprises a re-encoded candidate information word.
xi. the data derived from the one or more selected DCWs comprises a re-encoded candidate codeword.
xii. executing by a second processor of the plurality of processors comprises, upon occurrence of a cancellation criterion, canceling processing of data derived from a given selected DCW.
xiii. the cancellation criterion occurs when a count of DCWs with an associated ranking exceeding the ranking of the given selected DCW meets a DCW cancellation threshold.
xiv. the ranking associated with a DCW indicative of a metric of the DCW.
xv. the selection criterion occurs when a DCW has an associated ranking meeting a ranking selection threshold.
xvi. The selection criterion occurs when a DCW derived from a given input model has an associated ranking meeting an input model ranking selection threshold.
xvii. the selection criterion occurs when a DCW has the highest associated ranking of all DCWs derived from a given input model.
xviii. the error correction code is a generalized concatenated code.
xix. the ordered sequence of constituent codes usable for the sequential decoding of the error correction code is derived from an unfolded recursion of a layered factor graph of the generalized concatenated code.
xx. the ordered sequence of constituent codes usable for the sequential decoding of the error correction code is derived from a normal factor graph of the error correction code.
xxi. the error correction code is a polar code.
xxii. the data usable for decoding a next subsequent constituent code comprises a data indicative of a symbol likelihood estimate.
xxiii. the method additionally comprises:
  d) executing, by a third processor of the plurality of processors, a task of decoding a second subsequent constituent code, the executing comprising processing data derived from DCWs generated by the task of decoding a subsequent constituent code.

According to one aspect of the presently disclosed subject matter there is provided a decoder configured to perform sequential list decoding of an error correction code, the decoder comprising a memory and a plurality of processors, wherein:

a first processor of the plurality of processors is configured to obtain an ordered sequence of constituent codes usable for the sequential decoding of the error correction code;
a second processor of the plurality of processors is configured to execute a task of decoding a first constituent code, the executing comprising:
  a. generating a set of one or more DCWs usable to be selected for decoding a subsequent constituent code, each DCW associated with a respectively generated ranking;
  b. for the first constituent code, upon occurrence of a sufficiency criterion, and prior to completion by the first processor of the generating all DCWs and respectively associated rankings, selecting, in accordance with a selection criterion, at least one DCW, thereby giving rise to one or more selected DCWs;
a third processor of the plurality of processors is configured to execute a task of decoding a subsequent constituent code, the executing comprising processing data derived from the one or more selected DCWs to generate data usable for decoding a next subsequent constituent code.

In addition to the above features, the system according to this aspect of the presently disclosed subject matter can include the following additional feature:
i. the first processor, second processor, and third processor are the same processor.

Among the advantages of certain embodiments of the presently disclosed subject matter are low latency decoding, low power consumption, and better error-correction performance (lower frame-error-rate or bit-error-rate) compared to prior art solutions.

BRIEF DESCRIPTION OF THE DRAWINGS

In order to understand the invention and to see how it can be carried out in practice, embodiments will be described, by way of non-limiting examples, with reference to the accompanying drawings, in which:

FIG. 10 illustrates a time diagram of pipelined processing with early decision, according to some embodiments of the present subject matter; and FIG. 11 illustrates exemplary observed latency for three types of sequential list decoders in decoding four polar codes.

DETAILED DESCRIPTION

In the following detailed description, numerous specific details are set forth in order to provide a thorough understanding of the invention. However, it will be understood by those skilled, in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "representing", "comparing", "generating", "assessing", "matching", "updating" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, "processing element" and "controller" disclosed in the present application.

The terms "non-transitory memory" and "non-transitory storage medium" used herein should be expansively construed to cover any volatile or non-volatile computer memory suitable to the presently disclosed subject matter.

The operations in accordance with the teachings herein may be performed by a computer specially constructed for the desired purposes or by a general-purpose computer specially configured for the desired purpose by a computer program stored in a non-transitory computer-readable storage medium.

Embodiments of the presently disclosed subject not described with reference to any particular programming language. It will be appreciated that a variety of programming languages may be used to implement the teachings of the presently disclosed subject matter as described herein.

Figure 1:
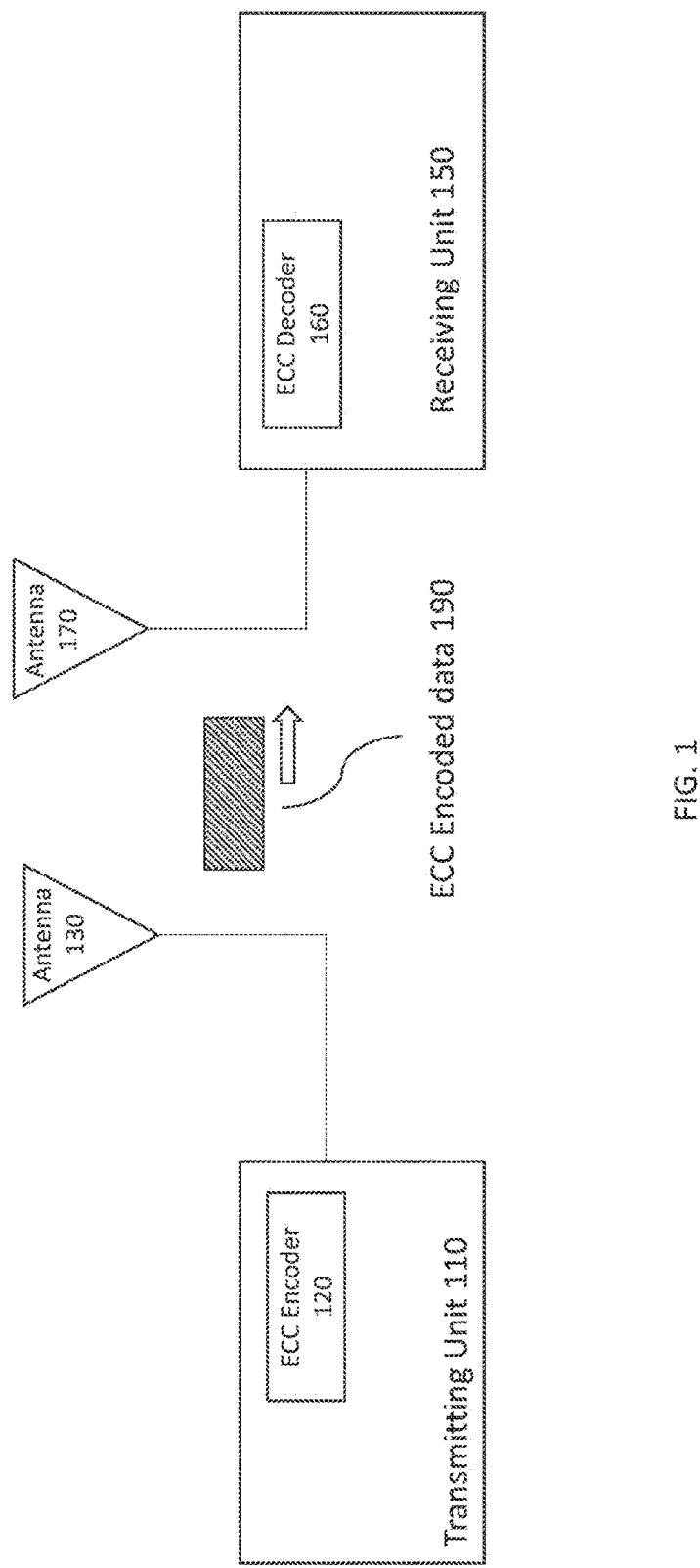
FIG. 1 illustrates a block diagram of a wireless communications network employing an ECC Decoder configured in accordance with certain embodiments of the presently disclosed subject matter.

Bearing this in mind, attention is drawn to FIG. 1 illustrating a block diagram of a wireless communications network employing an Error Correction Code (ECC) Decoder configured in accordance with certain embodiments of the presently disclosed subject matter.

The system includes a transmitting unit (110) configured to communicate wirelessly with a receiving unit (150). Wireless communication between transmitting unit (110) and receiving unit (150) can utilize, for example, a cellular technology capable of carrying, for example, data packets, and the wireless signal can be transmitted via antenna (130) and received over antenna (170). The wireless signal can carry, for example, packets such as the ECC encoded data (190) packet.

The wireless signal can be affected by signal dissipation and various kinds of electromagnetic interference which can in result in errors occurring in the data received at the receiving unit (150). By encoding using an Error Correction Code (such as Arikan's polar code) at the transmitter and then decoding at the receiver, such errors can be corrected. The communication system of FIG. 1 can thus be more resistant to interference and less error-prone than a system that does not use an ECC.

The transmitting unit (110) can contain an ECC encoder (120). The ECC encoder (120) processes the data that arrives for transmission at the receiving unit (150) (known as the information word), and can process it according to an Error Correction Code such as Arikan's polar code (resulting in a codeword) before transmission. Similarly, the receiving unit (150) can contain an ECC decoder (160). The ECC decoder (160) can process the codeword that arrives at the receiving unit (150) from the transmitting unit (110) (such as the ECC encoded data (190)), and can process it according to the Error Correction Code used at the ECC encoder (120) to restore the original information word as further detailed below with reference to FIGS. 3-7.

It is noted that the teachings of the presently disclosed subject matter are not bound by the wireless communications system described with reference to FIG. 1. Equivalent and/or modified functionality can be consolidated or divided in another manner and can be implemented in any appropriate combination of software with firmware and/or hardware and executed on a suitable device. The wireless communications system can be a standalone network entity, or integrated, fully or partly, with other network entities. It will be clear to one skilled in the art how an ECC decoder can be employed in other embodiments such as wired communication, storage systems etc.

Figure 2:
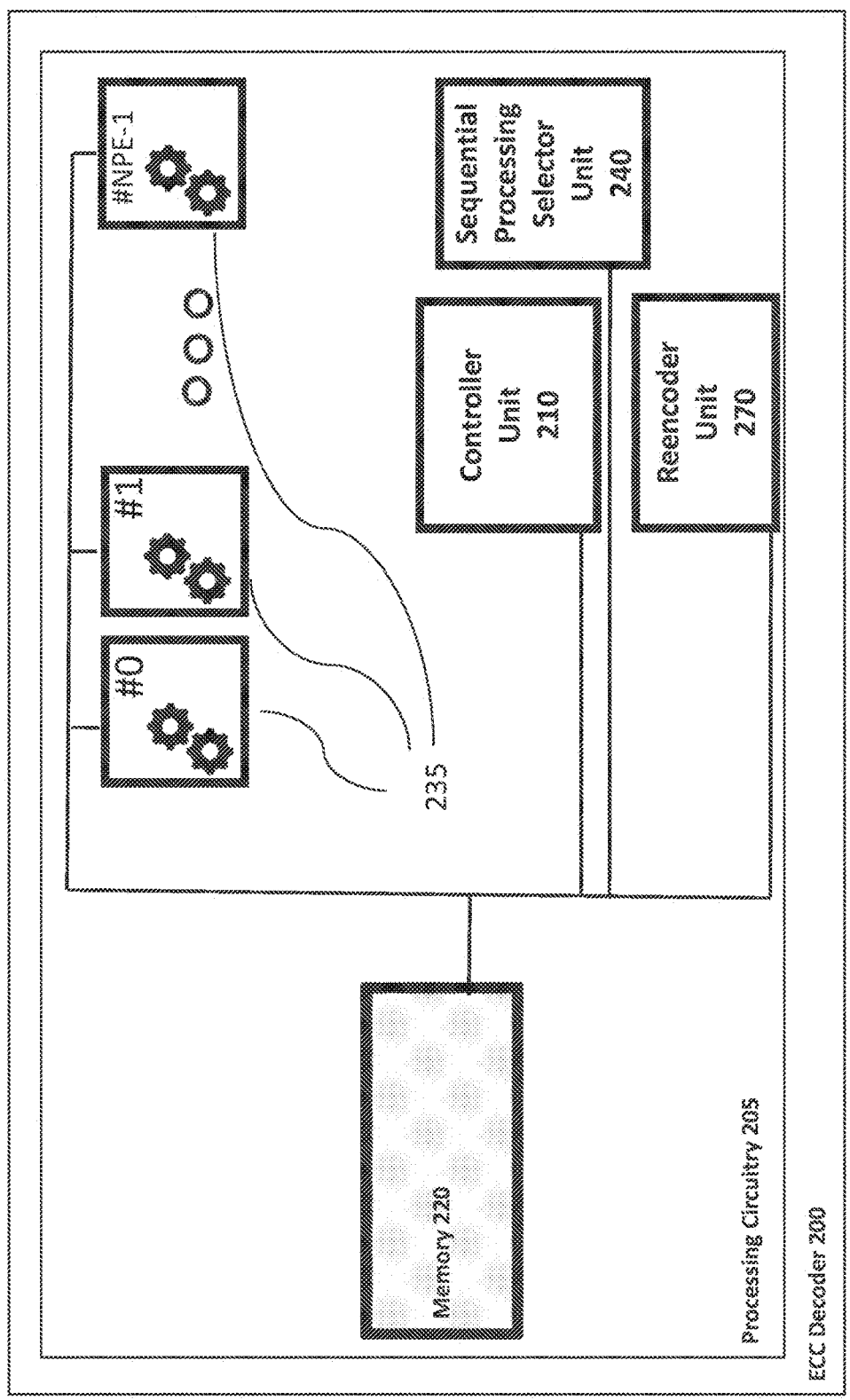
FIG. 2 illustrates a block diagram of an ECC Decoder and its components according to some embodiments of the presently disclosed subject matter.

FIG. 2 is a block diagram of an Error Correction Code (ECC) decoder (200) and its components according to some embodiments of the presently disclosed subject matter.

The illustrated ECC Decoder system comprises processing circuitry (205) comprising a processor (not shown separately within the processing circuitry) and a memory (220).

The processing circuitry (205) can comprise zero or more processing elements (235) configured to perform, for example, tasks for decoding of constituent codes as part of list sequential decoding of a generalized concatenated code codeword—as will be described in detail below with reference to FIG. 6. A processing element (235) can be, for example, a general purpose processor, a specialized Application Specific Integrated Circuit (ASIC), a single core in a multicore processor etc. A processing element (235) can also consist, for example, of multiple processors, multiple ASICs, combinations thereof etc.

As will be further detailed with reference to FIGS. 6-7, the processing circuitry (205) can be configured to execute several functional modules in accordance with computer-readable instructions implemented on a non-transitory computer-readable storage medium. Such functional modules are referred to hereinafter as comprised in the processing circuitry.

The processing circuitry (205) can comprise a controller unit (210), configured to receive a codeword of a particular Error Correction Code over an external interface (not shown), and store it in the Memory (220).

The controller unit (210) can subsequently initiate and orchestrate a process to decode the codeword so that an estimation of the original codeword (i.e. an estimation of the word as initially produced by the encoder unit (120)) is available in the memory (220).

In some embodiments of the presently disclosed subject matter, an estimation of the original information word (i.e. an estimation of the word as passed initially into the encoder unit (120)) is available in the memory (220) upon completion of the decoding. This process will be described in detail below with reference to FIG. 6.

It is noted that in some cases it can be sufficient for a decoding operation to generate, for example, an estimation of the original codeword prepared for transmission—without generating or maintaining an estimation of the original information word. It is further noted that in the case of, for example, systematic encoding, the symbols of the original information word appear among the symbols of the codeword, so that an estimation of information word symbols can be determined simply by selecting the appropriate symbols from an estimation of the original codeword transmitted.

The processing circuitry (205) can comprise a sequential processing selector unit (240), configured, for example, to construct information word candidates according to, for example, data written to memory by a processing element (235) and to then select "best-fit" candidates for continued processing—as will be described in detail below with reference to FIGS. 6-7.

The processing circuitry (205) can comprise a re-encoder unit (270), configured, for example, to apply an iterative mapping so as to convert the selected candidate information words back into codeword format, in preparation for the decoding of the next constituent code—as will be described in detail below with reference to FIG. 6.

It is noted that the teachings of the presently disclosed, subject matter are not bound by the ECC decoder system described with reference to FIG. 2. Equivalent and/or modified functionality can be consolidated or divided in another manner and can be implemented in any appropriate combination of software with firmware and/or hardware and executed on a suitable device.

Figure 3:
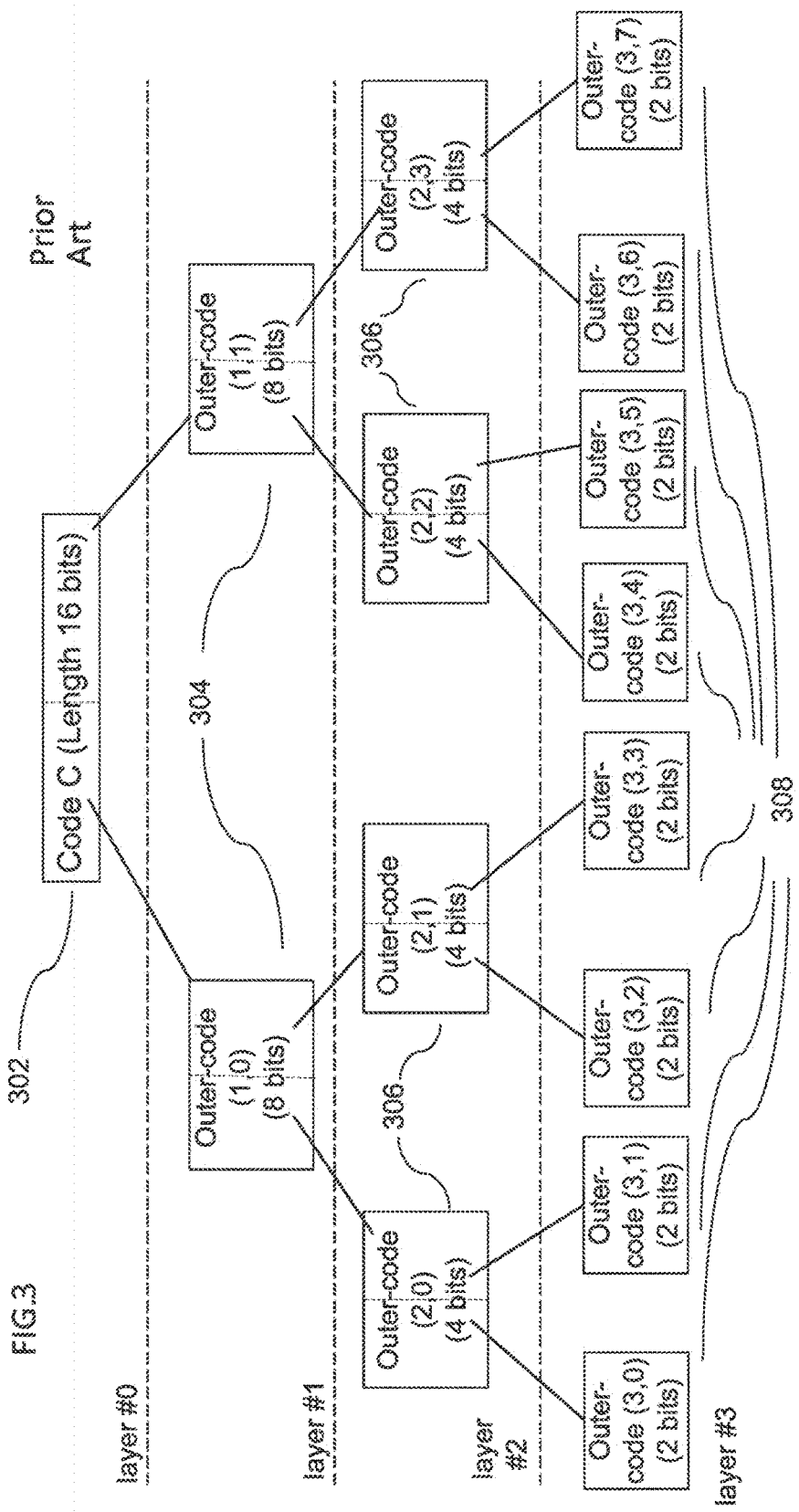
FIG. 3 illustrates an exemplary logical representation for a 16-bit generalized concatenated code in accordance with certain embodiments of the presently disclosed subject matter.

FIG. 3 illustrates, by way of non-limiting example, a layered factor graph representation of a 16 bit recursive generalized concatenated code.

In a generalized concatenated code (GCC), a complex code is constructed, for example, from a group of $N_{outer}$ outer-codes (also termed "constituent codes")—each of length $L_{outer}$. An inner-code (with associated inner mapping function $F_{inner}$ and length $L_{inner}$) is also, for example, utilized. A codeword of the GCC can be generated by creating a matrix of $N_{outer}$ rows and $L_{outer}$ columns—wherein each row is a codeword of the outer-code—and then applying $F_{inner}$ to each of the $L_{outer}$ columns of the matrix.

In a recursive GCC, a GCC encoding operation can be performed times—with the output of one encoding operation serving as input to a subsequent encoding. In the recursive structure, the constituent codes are themselves generalized concatenated codes. Each one of the $N_{outer}$ constituent codes itself comprises $N'_{outer}$ codes each of length $L'_{outer}$ where $L'_{outer} < L_{outer}$. If the inner mapping length is $L'_{inner}$, then $N_{outer} = L'_{inner} \cdot N'_{outer}$.

Arikan's polar code can be regarded as a non-limiting example of a recursive GCC, as a polar code of a particular length can be formalized as a concatenation of several smaller polar codes in conjunction with a kernel mapping (inner code).

More specifically, an Arikan polar code (over a binary alphabet) of length $N=2^m$ bits (with $m>1$) can be represented as 2 outer polar codes of length $2^{m-1}$ that are concatenated using the inner code g(u), wherein:

the two outer codes are defined as:

$$[\gamma_{i,j}]_{j=0}^{j=N/2-1} = g^{(n-1)}\left(u_{i \cdot \left(\frac{N}{2}\right)}^{(i+1) \cdot \left(\frac{N}{2}\right)-1}\right)$$

and $$[\gamma_{i,j}]_{j=0}^{j=N/2-1} = g^{(n-1)}\left(u_{i \cdot \left(\frac{N}{2}\right)}^{(i+1) \cdot \left(\frac{N}{2}\right)-1}\right)$$

$g^{(m)}(\cdot)$ is recursively defined as:
For m=1:

$$g^{(1)}(u) = g(u) = [u_0 + u_1, u_1]$$

For m>1:

$$g^{(m)}(u) = x_0^{N-1}$$

where $[x_{2j}, x_{2j+1}] = [\gamma_{0,j} + \gamma_{1,j}, \gamma_{1,j}]$ $j = 0, 1, 2, \ldots, \frac{N}{2}-1$ and $[\gamma_{i,j}]_{j=0}^{j=N/2-1} = g^{(n-1)}\left(u_{i \cdot \left(\frac{N}{2}\right)}^{(i+1) \cdot \left(\frac{N}{2}\right)-1}\right)$ and $u_0^{N-1}$ bits are the input information bits.

FIG. 3 consists of 4 layers (numbered 0 to 3), in which each layer contains nodes corresponding to the constituent codes of one recursion of the 16-bit generalized concatenated code being illustrated. The nodes are arranged in a hierarchy, where the nodes in a lower layer are constituent codes of particular nodes in the layer above. The solid lines between the nodes of different layers in FIG. 3 indicate which lower layer codes are constituents of which higher layer codes.

Thus: Layer 0 includes a single node (302) corresponding to the 16-bit codeword. Layer 1 includes 2 nodes (304) corresponding to the two 8-bit outer codewords which are constituent codes of 16-bit codeword. Layer 2 includes 4 nodes (306) corresponding to the 4 4-bit outer codewords each of which is a constituent code of one of the 8-bit codewords. The nodes (308) in layer 3 correspond to 2-bit codewords each of which is a constituent code of one of the 4-bit codewords. The 2-bit codewords in layer 3 do not include constituent codes themselves.

In FIG. 3 the outer codewords are labelled according to their layer and the order of appearance in the higher layer code e.g. "Outer Code (2,0)" refers to the codeword in layer 2 that corresponds to the first 4 bits of Outer Code (1,0).

The hierarchy of outer codes and layers illustrated in FIG. 3 can be utilized by, for example, sequential list decoding methods described below with reference to FIGS. 4-5 and FIGS. 6-7. In particular, the hierarchy can indicate what sequential decoding tasks can be carried out, and in what sequence—as will be described in more detail below with reference to FIGS. 4-5 and FIGS. 6-7.

The presently disclosed subject matter is applicable to a list sequential decoder for error correction codes for which a sequential representation of decoding based on constituent codes is available. By way of non-limiting example, the presently disclosed subject matter can be applicable to GCCs, convolutional polar codes, and MERA codes represented in such a manner.

Figure 4:
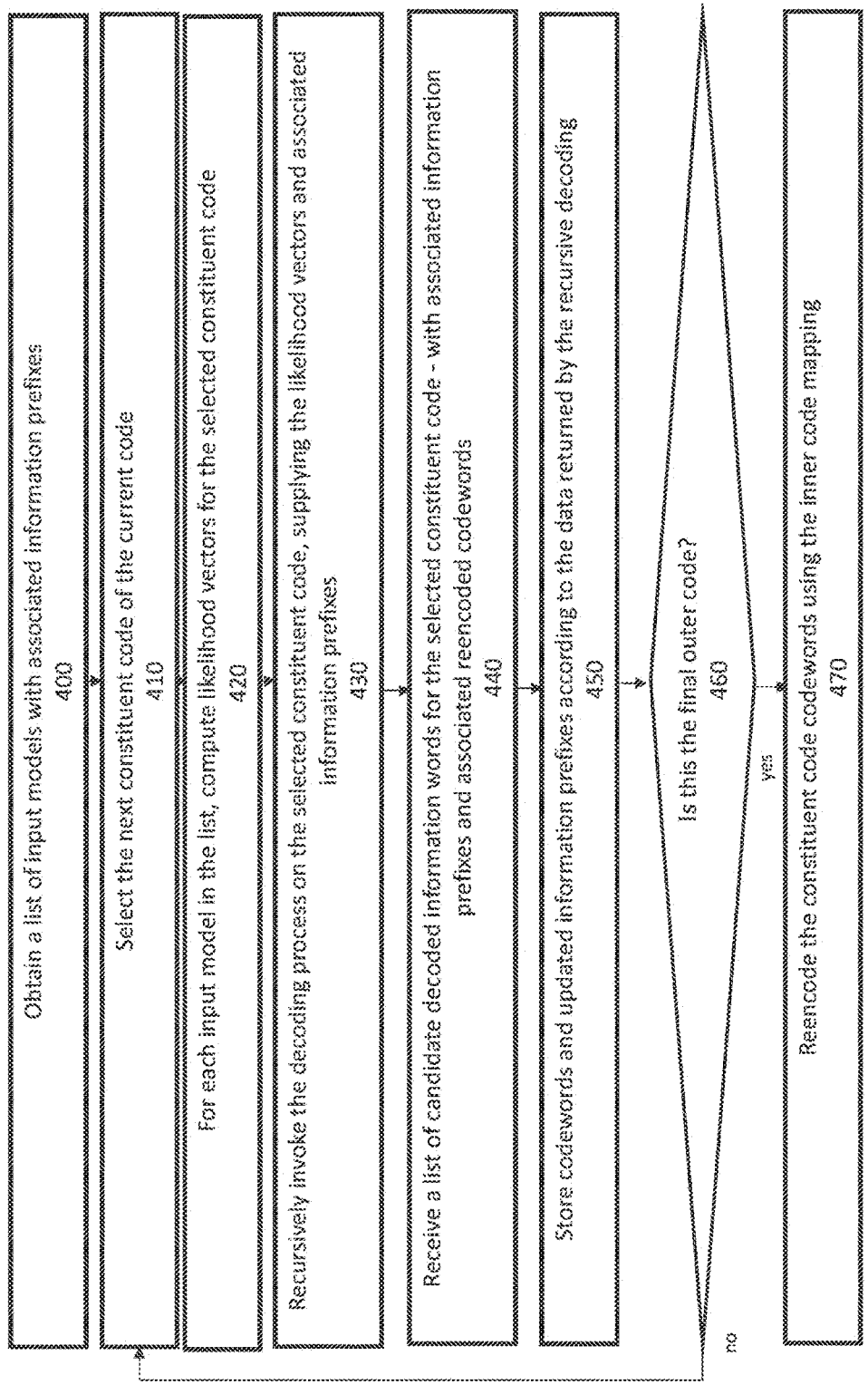
FIG. 4 illustrates a generalized flow-chart describing a prior art process for recursive sequential list decoding.

Attention is now directed to FIG. 4, which provides an exemplary flow diagram describing a prior art process for recursive sequential list decoding (with list size L) of a GCC for a received codeword of length N.

The term "sequential list decoding" can refer, by way of non-limiting example, to a decoding method in which segments of a codeword are decoded in a predefined sequence, and in which a certain number of decoding candidates (known as the "list size") is maintained as the decoding progresses. After the entire codeword is decoded, a single candidate from the list can be selected.

The prior art process illustrated in FIG. 4 is described, by way of non-limiting example, in section 4 of Presman and Litsyn, "Recursive descriptions of polar codes". Adv. in Math. of Comm. 11(1): 1-65 (2017) which is hereby incorporated by reference. In this prior art process, a task that decodes a codeword can recursively invoke a series of decodings of constituent codewords.

For convenience, the process is herein described according to an embodiment utilizing a general purpose computing system with a processor and memory, but it will be clear to one skilled in the art that the process is equally applicable for other platforms. For convenience, the process is herein described for a binary alphabet, but it will be clear to one skilled in the art that the process is equally applicable for a non-binary alphabet.

For each sequentially decoded constituent code, the decoding task utilizes a list of "input models" which provide the task with estimations of the data received from the communication medium—as modified according to the results of decoding of previous constituent codes (as will be described in detail below).

For a constituent code of length N, an input model, can, for example, include:
  A vector $LLH_0$ of length N in which each vector element contains an estimated likelihood that the corresponding transmitted bit of the codeword was 0.
  A vector $LLH_1$ of length N in which each vector element contains an estimated likelihood that the corresponding transmitted bit of the codeword was 1.

A likelihood value can be represented in the vectors as, for example, a floating point number between 0 and 1, a natural logarithm, or some other representation or an approximation thereof. Likelihood values can also be represented as, for example, the ratio between the likelihood of 0 and the likelihood of 1 ("likelihood ratio"), or as a logarithm of the ratio between the likelihood of 0 and the likelihood of 1 ("log-likelihood ratio) etc. The system (for example: the processor) can perform, for example, computations of likelihoods using one representation and, for example, store the likelihoods using a different representation.

There can be one input model available, or there can be more than one input model available to be used by the task.

An input model can be created from, for example, data received from a physical receiver attached, for example, to a communication medium. For example, in the case of decoding a codeword of a GCC that is represented at the highest layer of the hierarchical coding representation (as described above with reference to FIG. 3), an invoking task can create an input model based on bit estimations from signals read directly from the communication medium receiver. In this case there can be a single input model that represents the likelihood that signals observed at a receiver correspond to transmitted 0 or transmitted 1.

In the course of the sequential list decoding process, a task decoding a higher layer constituent code (as described above with reference to FIG. 3) can also create input models to be used by recursively invoked tasks decoding constituent codes of the layer below. In this case, the invoking task can build input models from, for example, re-encoded candidate decoded information words which result from each previously decoded constituent code (as will be described in detail below).

Early in the sequential list decoding process, there can be, for example, a small number of input models which correspond to the small number of constituent codes which have been estimated at that stage. Later in the sequential list decoding process, there can be, for example, L input models (where L is a maximum list length value used by the sequential decoding process) wherein each input model has an association with a candidate decoded information prefix in a list of L candidates being maintained by the task.

As a prerequisite for the sequential list decoding, the system (for example: the processor) can receive (400) a list of input models, where each input model specifies the likelihood of each bit in the vector being a 0 or 1, given, for example, the signaling data detected on the communication medium and, for example, according to an associated candidate decoded information prefix.

To begin recursive sequential list decoding (e.g. on the first iteration of the iterative loop), the system (for example: the processor) can select (410) the sequentially next constituent code from which the current code is derived—for example: the first constituent code from the layer below as indicated in a layered graph of the code. Considering as a non-limiting example the decoding of the code (1,0) in layer 1 of FIG. 3, the first constituent code (and thus the one that will be selected) is outer code (2,0) in layer 2. In the next iteration outer code (2,1) will be selected.

To prepare for the recursive step, the system (for example: the processor) can next prepare (420) likelihood estimations for the bits of the selected constituent code according to the input models and any previously decoded constituent codes. The system (for example: the processor) can prepare separate likelihoods according to each of the received input models, and can create an association between the prepared likelihoods structure and the input model and associated information prefix from which it was generated.

In some embodiments of the presently disclosed subject matter, the vector of likelihood values for a selected constituent code for a given input model can be calculated according to the following formula:

$$\tilde{\Lambda}_{r,t}^{(j)} = \log(Pr(Y=y, \{\gamma_{0,t} = \hat{\gamma}^{(j)}_{0,t}, \gamma_{1,t} = \hat{\gamma}^{(j)}_{1,t}, \ldots, \gamma_{s-1,t} = \hat{\gamma}^{(j)}_{s-1,t}\}, \text{Model } \sigma(j) | \gamma_{s,t} = r))$$

where:
  r indicates a possible symbol value (i.e. 0 or 1 for a binary alphabet)
  t indicates the index of the symbol in a constituent codeword
  s denotes is the index for the selected constituent code within the current layer
  Pr( ) denotes probability
  (Y=y) represents the event of the received media signals random variable Y equalling their received value y
  $\gamma_{i,t}$ denotes the constituent codeword's symbol of the transmitted codeword, where i is an index for an outer code within the current layer, and t indicates the index of the symbol in the outer-code codeword
  $\hat{\gamma}_{i,t}^{(j)}$ denotes the computed outer code matrix under input model j, where i is an index for an outer code within the current layer, and t indicates the index of the received symbol in the outer-code codeword
  Model σ(j) denotes the information prefix associated with the input In this example, the likelihood matrix value is represented as a logarithm, however it will be evident that the likelihood matrix value can be presented as a floating point value between 0 and 1 or some other representation.

At the recursive step, a decoding process can be invoked (430) on the selected constituent code (resulting in, for example, a recursive invocation of the FIG. 4 process or—in the case where the constituent is in the lowest layer—the FIG. 5 process), and supplying these newly calculated likelihood estimation vectors which can be used by the recursively invoked task as input models together with associated information prefixes. Thus, in the previously mentioned example of decoding of the code (1,0) in layer 1 of FIG. 3, the recursive step can invoke a new recursive instance of the FIG. 4 process on outer code (2,0) in layer 2.

Upon completion of the recursive invocation of the decoding process, the system (e.g. the processor) can receive (440):
- a list of selected candidate information words for the constituent code decoding (for example: L candidates). These are herein termed selected candidate information words (CIWs).
- for each candidate decoded information word:
  - an indication of which input model (of the current code) resulted in the likelihoods vector that generated the candidate—together with its associated information prefix
  - a codeword corresponding to the candidate decoded information word (i.e. a re-encoding of the information word for use in decoding the subsequent outer code)

Having received the results of the recursive invocation, the system (for example: the processor) can store (460) candidate codewords and build updated information prefixes according to the data returned by the recursive decoding.

The system (for example: the processor) can next determine (460) if there is an additional constituent code from the layer below which has not yet been decoded. If so, then this code can be selected (410) and the process can repeat itself.

When the outer codes have all been decoded, the process can, for example, reencode (470) (according to the inner code mapping) each of the final set of re-encoded selected candidate information words, so as to provide codeword input for the subsequent decoding task in a higher layer.

Figure 5:
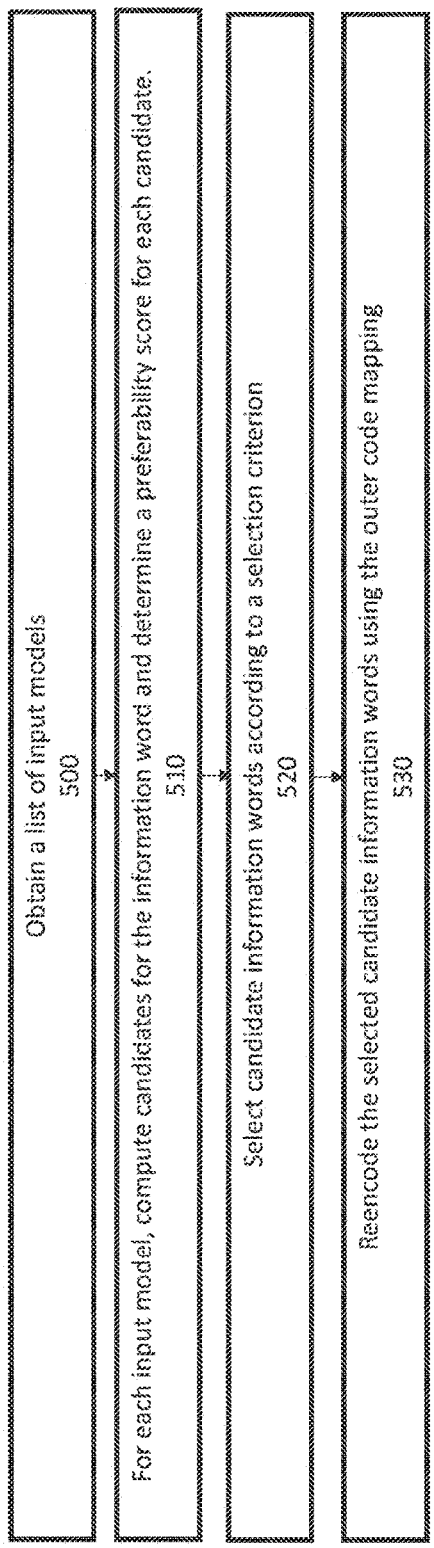
FIG. 5 illustrates a generalized flow-chart describing the recursion base case for a prior art process for recursive sequential list decoding.

Attention is now directed to FIG. 5, which provides an exemplary flow diagram describing the prior art process for decoding of a codeword in the recursion base case. This base case can correspond to the decoding of constituent codes shown in the lowest layer of FIG. 3 (constituent codes in the lowest layer are hereinafter termed "leaf" constituent codes).

To begin the decoding of the constituent code, the system (for example: a processor) can obtain (500) a list of input models to be utilized. The system (for example, a processor) can obtain these from, for example, the memory where they were written by an invoking task.

Next, the system (for example, the processor), can compute (510) candidate information words for the constituent code and can determine a ranking for each candidate according to the input models.

In some embodiments of the presently disclosed subject matter, the system (for example, a processor) can compute the ranking of, by way of non-limiting example, each possible leaf code candidate information word under each supplied input model. By way of non-limiting example, in the case of a 2 bit polar code (with no frozen bits), the rankings for information words 00, 01, 10, and 11 under each input model can be computed.

A ranking is a number that indicates the quality or likelihood of a candidate decoded information word. By way of non-limiting example, the ranking can be identical with, an estimation of, or otherwise based on the path metric. The path metric of a particular candidate information word u corresponding to a codeword c can be defined as the likelihood that the observed data (as received from the communication medium) would result from the transmission of codeword e corresponding to information word u introduced into the encoder before transmission on the communication medium.

In some embodiments of the presently disclosed subject matter, the path metric is represented using a logarithm—in which case it can be computed according to the following formula:

$$PM(c) = \log(Pr(Y=y|X=c))$$

where Y is a received channel vector, X is a transmitted vector and Pr( ) indicates probability.

By way of non-limiting example, in the case of a polar code, the path metric can be computed according to the formulae given in section 3 of Balatsoukas-Stimming et. al. "LLR-Based successive cancellation list decoding of Polar Codes" IEEE Trans. Signal Proc., 63 (2015), 5165-5179.

After the candidate information words with their rankings have been generated, the system (for example, the processor) can select (520) some number (for example, L) of the candidate information words (together with their associated input models) for further processing according to some method. For example, the L information word candidates with the top rankings should be selected.

It is noted that even if the process generally selects L candidates, early in the operation of the recursive process, the total number of possible candidates might be a number smaller than L.

Next, the system (e.g. the processor) can compute a re-encoding (530) of each of the selected candidate information words (according to the outer code mapping), resulting in a list of re-encoded selected candidate information words corresponding to the selected candidate information words. For each re-encoded selected candidate information word, the system (e.g. the processor) can also record which input model was used to generate the candidate and make this data available in memory for use by an invoking task.

In some embodiments of prior art methods, the decoding of a codeword in the recursion base case can directly generate candidate codewords (CWs) with associated rankings—without first computing candidate information words. In such cases, the system (e.g. the processor) selects CWs rather than CIWs, and does not perform re-encoding. Such methods can be useful, for example, where systematic encoding is employed—as in such cases it may be unnecessary to maintain the original information word in memory.

Figure 6:
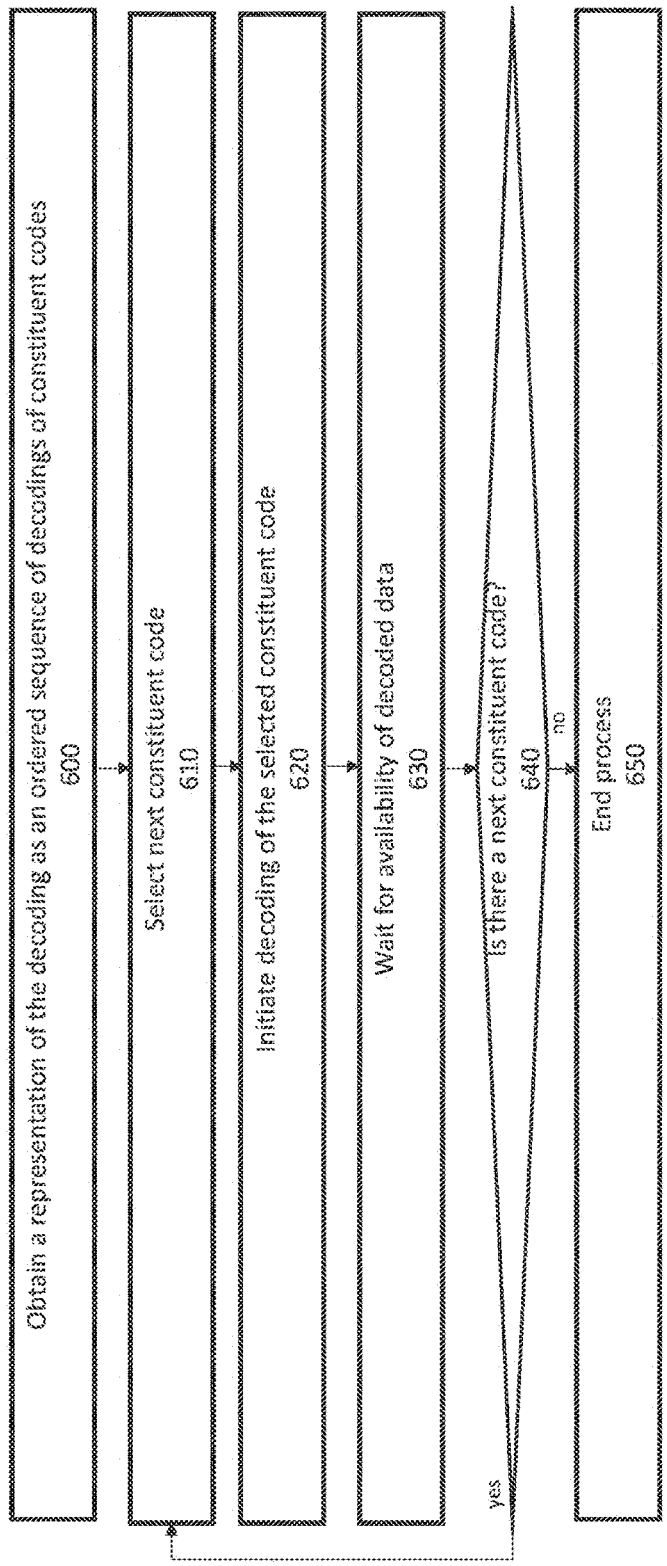
FIG. 6 illustrates a generalized flow-chart of sequential list decoding in accordance with certain embodiments of the presently disclosed subject matter.

Attention is now drawn to FIG. 6, which illustrates an exemplary flow diagram of a sequential list decoding process according to some embodiments of the presently disclosed subject matter. The process is described, by way of non-limiting example, for an implementation utilizing the structure illustrated in FIG. 2. However, it is to be understood that the method can be embodied on various implementation platforms, such as—for example—a single multicore CPU, a system-on-chip, etc.

It is recalled that, as described above with reference to FIG. 3 and FIGS. 4-5, in some embodiments of the presently disclosed subject matter, the generalized concatenated code is decoded by sequentially decoding constituent codes in the order indicated by the layered decoding representation and recursion process. This ordered sequence of constituent codes can be illustrated in a non-recursive manner using a list, a graph, or embodied in a software or hardware system. The term "unfolded recursion" is used to describe such a sequential listing of constituent codes.

By way of non-limiting example, for the code illustrated in FIG. 3 and according to the method described in FIGS. 4-5 the following unfolded recursion is indicated:
1. Calculate likelihoods (input model) for Outer Code (1,0) (as part of processing non-leaf Code C)
2. Calculate likelihoods (input models) for Outer Code (2,0) (as part of processing non-leaf Outer Code (1,0))
3. Calculate likelihoods (input models) for leaf Outer Code (3,0) (as part of processing leaf Outer Code (2,0))
4. Decode leaf Outer Code (3,0)
5. Calculate likelihoods (input models) for leaf Outer Code (3,1) (as part of processing Outer Code (2,0))
6. Decode leaf Outer Code (3,1)
7. Re-encode selected candidates of Outer (2,0)
and so forth.

It is observed that, according to some embodiments of the presently disclosed subject matter, in an unfolded recursion of a generalized concatenated code, decoding tasks of non-leaf constituent codes are interleaved with decoding of leaf constituent codes. For example, in the list above, the decoding of Outer Code (3,0) and also (3,1) occurs between decoding tasks of Outer Code (2,0).

In some embodiments of the presently disclosed subject matter, the decoder can utilize an ordered sequence of constituent codes that corresponds to, by way of non-limiting example, an unfolded recursion deriving from a layered graph of a generalized constituent code.

In some embodiments of the presently disclosed subject matter, the decoder can utilize an ordered sequence of constituent codes that corresponds to, by way of non-limiting example, a normal factor graph of the code (normal factor graph representations of codes are described in G. D. Forney, "Codes on Graphs: Fundamentals," in IEEE Transactions on Information Theory, vol. 60, no. 10, pp. 5809-5826, October 2014), In some embodiments of the presently disclosed subject matter, the decoder can utilize an ordered sequence of constituent codes that corresponds to, by way of non-limiting example, a factor graph of the code (factor graph representations of codes are described in F. R. Kschischang B. J. Frey H.-A. Loeliger "Factor graphs and the sum-product algorithm," in IEEE Transactions on Information Theory, vol. 47 no. 2 pp. 498-519 February 2001).

The description that follows uses the terms "preceding code" (or "preceding codeword") and "subsequent code" (or "subsequent codeword") to refer to the order indicated by a sequence of constituent codes (or interleaved decoding operations of constituent codes) such as, for example, these ordered sequences.

According to some embodiments of the presently disclosed subject matter, as a prerequisite to sequential list decoding, the system (e.g. the controller unit (210)) can obtain (600) a representation of the code as an ordered sequence of constituent codes usable for sequential decoding.

The system (e.g. the controller unit (210)) can, for example, retrieve such a representation that is pre-stored in memory (220). Alternatively the representation can, for example, be derived by the system (e.g. the controller unit (210)) from a different representation such as the graph shown in FIG. 3 stored in memory (220). Alternatively the representation can, for example, be hardcoded into the routines of the software code or Application Specific Integrated Circuit (ASIC) being used to execute the decoding.

In the process described in FIG. 6, the system can initially utilize, for example, an input model representing bit estimates of the signals received on the communications medium—as described above with reference to FIG. 4. The system (for example: the controller unit (210)) can sequentially initiate tasks to decode constituent codes according to the obtained ordered sequence of constituent codes.

In some embodiments of the presently disclosed subject matter, the decoding of a constituent code can result in, for example, a list of re-encoded selected candidate information words, where each re-encoded selected candidate information words can be associated with an information prefix representing the already-decoded bits of the codeword as well as a ranking. Finally, at the end of the process, a list of, for example, decoded candidate information words and associated rankings for the initial code, can be available.

In some embodiments of the presently disclosed subject matter, at the end of the process, a list of estimations of, for example, the transmitted codeword and associated rankings for the initial code, can be available. In the case of, for example, systematic encoding, the symbols of the user's data (i.e. information word) can occur in the transmitted codeword so that a decoder might, for example, generate estimations of the transmitted codeword only. It is noted that in systematic encoding, the symbols of the information word can appear in the transmitted codeword in their original order, or the symbols can appear in a permuted order. In both cases the system (for example: the controller unit) is able to extract the information word from an estimation of the transmitted codeword.

To begin the decoding of a codeword, the system (for example: the controller unit (210)) can select (610) the next constituent code of the codeword (which will—at the beginning of the process—be the first constituent code from ordered sequence of constituent codes).

It is recalled that when the ordered sequence of constituent codes is according to an unfolded recursion of a generalized concatenated code, leaf code processing can be interleaved with non-leaf code processing—with the result that the non-leaf code can appear more than once in the ordered sequence of constituent codes.

By way of non-limiting example, the ordered sequence of constituent codes (above) for the code illustrated in FIG. 3 shows the following sequence:
Calculate likelihoods (input models) for leaf Outer Code (3,0) (as part of processing leaf Outer Code (2,0))
Decode leaf Outer Code (3,0)
Calculate likelihoods (input models) for leaf Outer Code (3,1) (as part of processing Outer Code (2,0))
Decode leaf Outer Code (3,1)
Re-encode selected candidates of Outer Code (2,0)

Next, the system (for example: the controller) can the initiate (620) the decoding of the selected codeword utilizing the structures shown in FIG. 2.

The method for initiating processing of the selected constituent code can depend on whether the code is a leaf code or a non-leaf code:
a) Non-leaf: If the selected constituent code is a non-leaf code—in some embodiments of the presently disclosed subject matter—in the case of a generalized concatenated code when the subsequent constituent code is a leaf code, the system (for example: the controller) can initiate one or more tasks on one or more processing elements (235) to compute—according to each received input model—bit likelihoods (or more generally symbol likelihoods) for use as input models for decoding the subsequent constituent code. Computation of the bit (or symbol) likelihoods can be according to the method described above, with reference to FIG. 4.

In some embodiments of the presently disclosed, subject matter, to decode a non-leaf constituent code of a generalized concatenated code when the subsequent constituent code is a non-leaf code, the system (for example: the controller) can initiate one or more tasks on one or more processing elements (235) to compute—according to each received input model—a re-encoding of the non-leaf constituent code according to the code's inner mapping. The re-encoding of the non-leaf constituent code can be according to the method described above, with reference to FIG. 4.

In some embodiments of the presently disclosed subject matter, the system (for example: controller unit (210)) can initiate multiple tasks for decoding of a constituent code—with each task running on a different processing element (235). For example: the controller unit (210) can initiate tasks in a manner where different processing elements (235) are performing decoding-related computing (such as bit likelihood computation) for different input models (i.e. parallelized processing).

Alternatively, for example, the controller (210) can initiate tasks in a manner where different processing elements (235) execute different stages of the decoding process concurrently for different decoding candidates or different input models—so that the processing is handled sequentially on a series of distinct processing elements (235) (i.e. pipelined processing).

Leaf: If the selected constituent code is a leaf code, then the system (for example the controller) can initiate the decoding of the leaf code according to the method described in detail below with reference to FIG. 7.

After the initiation of task(s) for decoding the constituent code, the system (for example, the controller) can, for example, wait (630) for the availability of decoding data resulting from the initiated decoding of the current constituent code.

In the case of a leaf code or in the case of a non-leaf code preceding a non-leaf code, the resulting decoding data can include, for example, candidate information words and associated outer-code-re-encoded codewords—together with associated input models and preference scores.

In the case of a non-leaf code preceding a leaf code, the resulting decoding data can include, for example, input models and associated preference scores.

The resulting decoding data can become available, example, upon completion of the decoding of the current constituent code.

Figure 7:
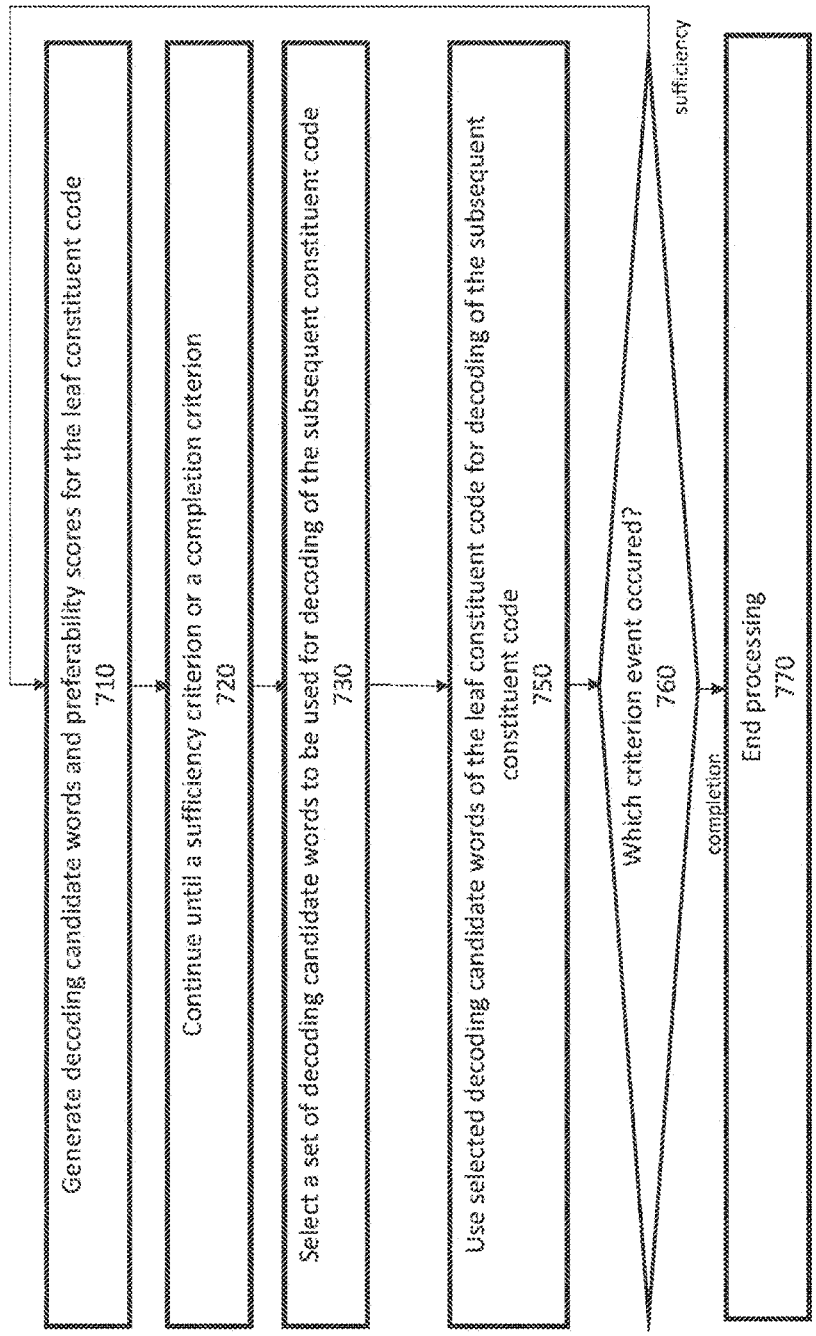
FIG. 7 illustrates a generalized flow-chart of the candidate generation and candidate selection steps of sequential list decoding in accordance with certain embodiments of the presently disclosed subject matter.

In some embodiments of the presently disclosed subject matter, if the "early decision" as described below with reference to FIG. 7 is utilized, then the resulting decoding data can become available before completion of the decoding of the current constituent code. In this case, the system can, for example, decode multiple constituent codes simultaneously.

Next, the system (for example: the controller) can check (640) if there is a subsequent constituent code. If so, then the code is selected (610). Otherwise decoding is complete and the process terminates (650).

Among the advantages of the presently disclosed subject matter is the capability of "early decision" i.e. beginning the selection of candidate information words for further processing according to a "sufficiency criterion" rather than requiring the process to wait until all information word candidates have been generated and scored—as detailed below with reference to FIG. 7.

It is noted that the teachings of the presently disclosed subject matter are not bound by the flow chart illustrated in FIG. 6, and that the illustrated operations can occur out of the illustrated order. It is also noted that whilst the flow chart is described with reference to elements of system (200), this is by no means binding, and the operations can be performed by elements other than those described herein.

Attention is now drawn to FIG. 7, which illustrates an exemplary flow diagram showing details of the decoding process for, by way of non-limiting example, a leaf constituent code of the sequential list decoding process described above with reference to FIG. 6, according to some embodiments of the presently disclosed subject matter.

In some embodiments of the presently disclosed subject matter, the decoder can perform early decision making with respect to selection of the decoding candidate words (DCWs) of, for example, a leaf constituent code, to be used for the decoding of subsequent constituent codes. The system (for example the controller unit (210)) can initiate the selection of these "best" decoding candidates (by for example the sequential processing selector unit (240)) as soon as a "sufficiency criterion" (to be described below) has been satisfied i.e. the selection and subsequent processing does not wait until all the DCWs have been generated and scored.

Among the advantages of the early decision making are the reduction in latency and processing time that results from concurrent processing of multiple constituent codes, and reduced power consumption.

The decoding process can begin, for example, with the system (for example: the sequential processing selector unit (240)) generating (710) constituent code DCWs (according to received input models) and computing associated rankings for the candidates. For example, the controller unit (210) can send a command instructing the sequential processing selector unit (240) to begin this processing.

The generation of DCWs and computation of associated rankings for the candidates, can be according to, for example, the method described above with reference to FIG. 5.

In some embodiments of the presently disclosed subject matter, the received input model can have an associated input model ranking. The received input model preference score can, for example, be derived from the ranking of the most recent DCW from which the input model was derived.

Optionally, the system (for example: the sequential processing selector unit (240)) can generate DCWs and rankings from the input models in an order derived from the input model rankings, so that rankings for DCWs resulting from an input model with a higher input model ranking are generated first—this can lead to generating the "best" DCWs earlier in the process and can render the early decision making more effective.

The system (for example: the sequential processing selector unit (240)) can continue generation of DCWs and rankings until one of the following events occurs (720):

a) Satisfaction of a completion criterion. A completion criterion is an event indicating the completion of the generation of DCWs and associated rankings for the constituent code—for example: generation of all possible DCWs and associated preference scores for the constituent code.

By way of non-limiting example, for a leaf constituent code of length 2 receiving four input models, a completion criterion can be satisfied when the task has generated 16 candidates corresponding to the 00, 01, 10, and 11 values of the information word under each input model—together with their preference scores.

b) Satisfaction of a sufficiency criterion. A sufficiency criterion is an event that can signal, according to some embodiments of the presently disclosed subject matter, that the quality or quantity of the already generated DCWs is such that processing of the subsequent constituent code can begin on these candidates. Non-limiting examples of a sufficiency criterion include:

the count of generated DCWs and associated rankings is equal to or greater than a generated DCW threshold the count of DCWs with a ranking meeting a ranking threshold is equal to or greater than a high ranking DCW count threshold the count of input models for which all DCWs and rankings thereof have been generated is equal to or greater than an input model threshold combinations of the above The thresholds can be predefined or can vary according to events occurring during the decoding. The process can utilize different thresholds at different stages of the decoding. The sufficiency criteria can be predefined or can vary according to events occurring during the decoding. The process can utilize different sufficiency criteria at different stages of the decoding.

After the occurrence of a sufficiency criterion or completion criterion, the system (for example: the sequential processing selector unit (240)) can next select (730) a set of DCWs according to, for example, a selection criterion (described below). The selected DCWs can then be used, for example, for decoding the subsequent constituent code.

As the system (for example: the sequential processing selector unit (240)) selects DCWs and associated preference scores, it can store this data into the memory (220).

A selection criterion is a characteristic that the system (for example: the sequential selector processing unit (240)) can use to select DCWs for use in decoding of subsequent constituent codes. Non-limiting examples of a selection criterion include:

a DCW has a ranking meeting a ranking selection threshold a DCW derived from a given input model has a ranking meeting an input model ranking selection threshold a DCW has the highest ranking of all DCWs derived from a given input model a DCW has the highest ranking of all DCWs derived from input models from which no DCW has yet been selected.

The thresholds can be predefined or can vary according to events occurring during the decoding. The process can utilize different thresholds at different stages of the decoding. The selection criteria can be predefined or can vary according to events occurring during the decoding. The process can utilize different selection criteria at different stages of the decoding.

In some embodiments of the present subject matter, DCWs can be candidate information words. In this case, after the selection of the set of DCWs, the system (for example: the re-encoder unit (270)) can next re-encode the selected candidate information words according to the outer-code, and can store the re-encoded selected candidate information words in memory (220). The re-encoding can be according to the re-encoding method described above (with reference to FIG. 5). The re-encoded selected candidate information words can be used, for example, for the task of decoding the subsequent constituent code.

In some embodiments of the present subject matter, DCWs can be outer-code codewords. In this case, after the selection of the set of DCWs, the selected candidate outer-code codewords can be used, for example, for the task of decoding the subsequent constituent code.

The system (for example: a processing element (235) executing a task of decoding the subsequent constituent code)—can next use (750) data derived from the one or more selected DCWs to generate data usable for decoding a next subsequent constituent code.

By way of non-limiting example, in a case where DCWs are candidate information words, the system (for example the controller unit (210)) can next initiate a task for decoding a subsequent constituent code on one or more processing element(s) (235). The task can then, for example, access re-encoded selected candidate information words in memory (220) and use (750) these—in conjunction with the input models from which the selected DCWs were generated—to compute symbol likelihoods for use by the decoding of the next subsequent constituent code.

By way of non-limiting example, in a case where DCWs are outer-code codewords, the system (for example the controller unit (210)) can next initiate a task for decoding a subsequent constituent code on one or more processing element(s) (235). The task can then, for example, access outer-code codewords in memory (220) and use (750) these—in conjunction with the input models from which the selected DCWs were generated—to compute symbol likelihoods for use by the decoding of the next subsequent constituent code.

It is recalled that the candidate generation (710) and candidate selection (730) performed by—for example—the sequential processing selector unit (240), the re-encoding (740) performed by—for example—the re-encoding unit (270), and the task of decoding (750) the subsequent constituent code performed by—for example—a processing element (235), can execute concurrently with each other.

If a sufficiency criterion (760) was satisfied before the completion criterion (i.e. "early decision making" is taking place), candidate generation (710) and the ensuing processing continue until the satisfaction of a completion criterion. In this case, the decoding of subsequent constituent codes—utilizing earlier generated candidates—can execute concurrently with the candidate generation (and preference score calculation), candidate selection, and re-encoding of the later-generated candidates of the leaf constituent code.

In some embodiments of the presently disclosed subject matter, the sufficiency criterion can be reset after being initially satisfied—so that after the initial candidates are provided to the task of decoding the subsequent constituent code, there can be a delay until a sufficiency criterion is again satisfied.

By way of non-limiting example, in a case where candidates and associated preference scores for outer code (3,4) of FIG. 3 are being generated by the sequential processing selector unit (240), the system (for example the controller unit (210)), upon occurrence of a sufficiency criterion, can instruct a task for decoding outer code (3,5) (for example, running on a processing element (235)) to utilize the re-encoded selected candidate information word candidates of outer code (3,4)—concurrent with generation of the remainder of the candidates of outer code (3,4). It is noted that in the ordered sequence of constituent codes described above with reference to FIG. 6, preparation of the likelihoods for decoding outer code (3,5) is subsequent to the decoding of outer code (3,4).

When satisfaction of a completion criterion has occurred (760), then candidate generation and candidate selection for the leaf constituent code is complete, and the process terminates (770).

It is recalled that, in some embodiments of the presently disclosed subject matter, the system (for example the sequential processing selector unit (240)) can limit the number of selected DCWs to a particular limit L (i.e. the "list size" of list sequential decoding).

Optionally, when the system (e.g. the controller (210)) is performing early decision making—so that some DCWs are selected and then utilized for decoding a subsequent constituent code prior to the completion of the generation of DCWs of the preceding constituent code—the system (for example the sequential processing selector unit (240)) can elect to output a number of DCWs greater than L. The system (for example the sequential processing selector unit (240)) can elect to output a number of candidates greater than L if, by way of non-limiting example, a DCW with a high ranking was generated after L candidates were already selected. Alternatively, by way of non-limiting example, the system (for example the sequential processing selector unit (240)) can elect to output a number of DCWs greater than L if, by way of non-limiting example, a DCW with a high ranking was generated after n DCWs with a lower ranking were already selected, for some number n.

In some embodiments of the presently disclosed subject matter, the system (for example: a processing element (235) executing a task of decoding of the second constituent code) can, upon satisfaction of a cancellation criterion (described below) halt further processing of a selected DCW (this is termed "cancellation").

The following is a non-limiting example of a cancellation criterion:

the system (for example the sequential processing selector unit (240)) has already selected a cancellation threshold number of DCWs with rankings higher than the given selected candidate information word.

A particular embodiment of the presently disclosed subject matter can utilize a particular cancellation criterion (or set of cancellation criteria), or can utilize different cancellation criteria at different stages of the decoding.

In some embodiments of the presently disclosed subject matter, the system (for example, the controller (210)) can, at one stage of the decoding processing, initiate tasks to run on multiple processing elements for parallelized or pipelined decoding of a single constituent code (as described above with reference to FIG. 6) and—at another stage of the processing—utilize early decision making (as described above with reference to FIG. 7)—to enable concurrent decoding of two different constituent codes.

It is noted that the teachings of the presently disclosed subject matter are not bound by the flow chart illustrated in FIG. 7, and that the illustrated operations can occur out of the illustrated order. It is also noted that whilst the flow chart is described with reference to elements of system (200), this is by no means binding, and the operations can be performed by elements other than those described herein.

Figure 8:
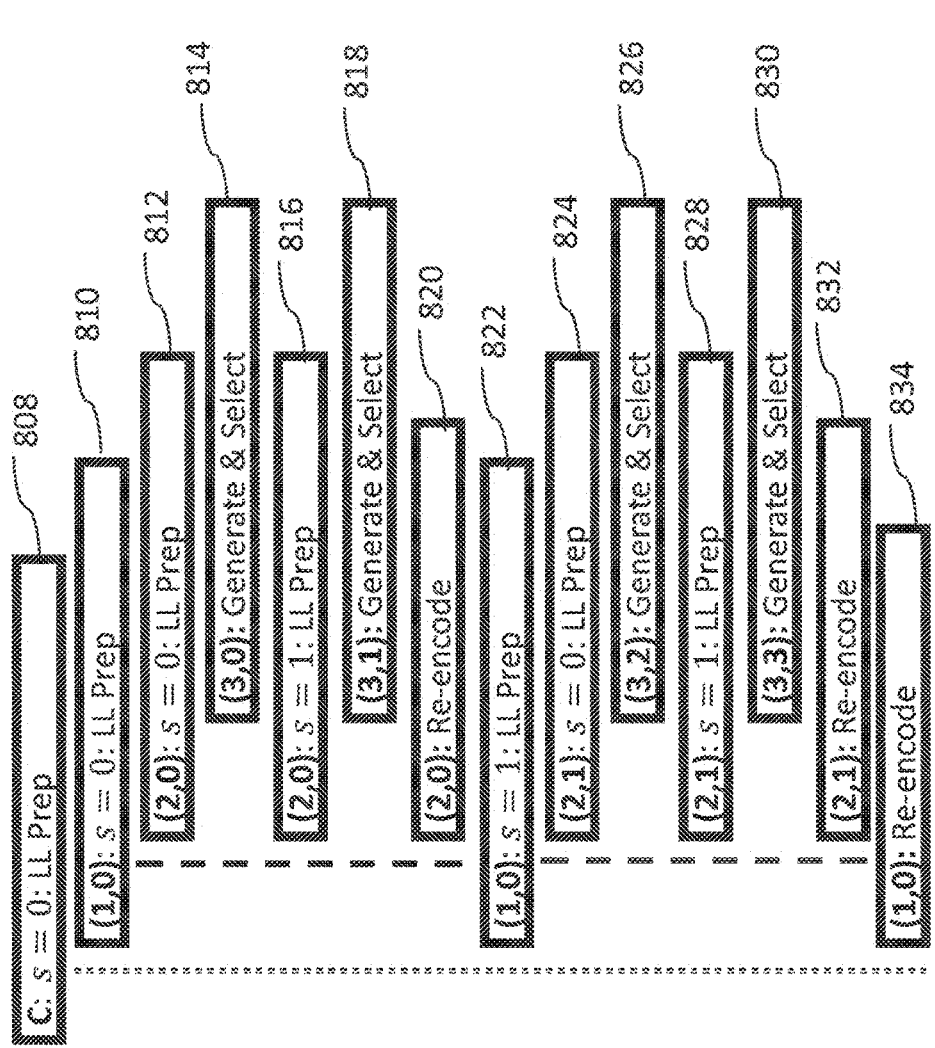
FIG. 8 illustrates a time diagram illustrating tasks of sequential list decoding taking place concurrently or sequentially on specific hardware, according to certain implementations of the current subject matter.

Attention is drawn to FIG. 8, which is a time diagram illustrating, by way of non-limiting example, tasks of sequential list decoding taking place concurrently or sequentially on specific hardware, according to certain implementations of the presently disclosed subject matter.

For convenience, three types of tasks are illustrated: (i) likelihood preparation generation of codewords and selection of candidates decoding paths (iii) re-encoding operations. These tasks can be performed, by way of non-limiting example, as described above with reference to FIG. 6. For each operation, the ECC on which the algorithm operates is denoted by using the notation of FIG. 3. For this example, the following assignment of rates to layer #3 outer-codes is assumed:

| Rate | Outer-Code |
| --- | --- |
| 0 | (3, 0) |
| 0.5 | (3, 1), (3, 2) |
| 1 | (3, 3), (3, 4), (3, 5), (3, 6), (3, 7) |

Moreover, it is assumed that that the starting LL matrix is stored as one row (e.g. row 0) of the of LL memory. Moreover, $L_{in}=1$ and $L=8$ (maximum list size).

1) Task 808: given the source LL matrix PEs (235) are used to calculate the input matrix to the decoder of (1,0) outer-code. It is noted that in some embodiments of the presently disclosed subject matter, $\gamma$ memory (outer code memory) does not contain previous decisions, and, as such, PEs (235) only need the LL-Memory values. It is further noted that because there are eight realizations of the inner code in C (each one of length two bits), the system may use at most eight PEs (235) simultaneously to perform this task. The LL results may be stored in a certain row in LL memory (e.g. row 1).

2) Task 810: list sequential decoding of outer-code (1,0) has been invoked. Thus, the next operation is to compute input LLs for the decoding task of outer-code (2,0) utilizing row 1 of the LL memory. Being of length eight bits, there are four realizations of the inner code (each one of length two bits) in outer-code (2,0), and, as a consequence, the system may use at most four PEs (235) simultaneously to perform this task. The resultant LL matrix values may be stored in row 2 of LL memory.

3) Task 812: list sequential decoding of outer-code (2,0) has been invoked. Thus, the next operation is to compute input LLs for the decoding task of outer-code (3,0) utilizing row 2 of the LL memory. Being of length four bits, there are two realizations of the inner code (of length two bits) in outer-code (3,0) and as a consequence the system may use at most two PEs (235) simultaneously to perform this task. It is assumed that the resultant LL matrix is transferred to, for example, Sequential Processing Selector Unit (240) for candidate generation.

4) Task 814: decoding of outer-code (3,0) has been invoked. Outer-code (3,0) is length two bits code of rate 0. As such, it has only one valid codeword that may be generated by the candidates generator and may be approved by the selector of the Sequential Processing Selector Unit (240). The $\gamma$ memory is updated to hold this selection (e.g. on row 0) and $\sigma$ memory (input model pointers memory) may remain the same.

5) Task 816: calculates the input LL memory to outer-code (3,1) by using the PEs (235) on row 2 of the LL memory and row 0 of $\gamma$ memory. Results are transferred to candidates generator of Sequential Processing Selector Unit (240).

6) Task 818: decodes outer-code (3,1). Outer-code (3,1) is length two bits code of rate 0.5. As such it has only two valid codewords that may be generated by the candidates generator and may be approved by the selector of Sequential Processing Selector Unit (240). The $\gamma$ memory is updated to hold this selection on rows 1,2) and σ memory is further updated.

7) Task 820: Re-Encoder Unit (270) employs the inner mapping of code (2,0) and may store the two results (each one corresponding to different candidate) in rows 3 and 4 of γ memory.

8) Task 822: prepares LL inputs for outer-code (2,1) in decoding of outer-code (1,0), utilizing row 1 of the LL memory and using row numbers 3 and 4 of γ memory. Since (1,0) is of length eight bits, there may be four realizations of inner code (each one of length two bits) in outer-code (1,0) and therefore at most four PEs (235) may be used simultaneously to perform this task for each list item. The two results may be stored in rows 3 and 4 of LL memory.

9) Task 824: list sequential decoding of outer-code (2,1) has been invoked using rows 3 and 4 of the LL memory in order to compute input LLs for the decoding task of outer-code (3,2). Outer-code (2,1) is of length four bits, therefore there are two realizations of the inner code (each one of length two bits) and consequently at most two PEs (235) (per list option) may be used simultaneously to perform this task. It is assumed that the resultant LL matrix is transferred to, for example, first Sequential Processing Selector Unit (240) for candidate generation.

10) Task 826: for each one of the two decoding paths (information prefixes), the candidates generator of Sequential Processing Selector Unit (240) suggests two possible codewords for outer-code (3,2) (because it has rate 0.5) resulting in a total of four outcomes. The selector of the Sequential Processing Selector Unit (240) may approve them all (because there are still less than L=8 candidates) and the γ memory is updated. It may be assumed that resultant codewords of (3,2) are stored in rows 5-8 of γ memory.

11) Task 828: prepares the LL inputs to the decoder of outer-code (3,3) as part of decoding outer-code (2,1). LL preparation (for outer-code (3,3)) is done by PEs (235) using rows 3,4 of LL memory and rows 5-8 of the γ memory.

12) Task 830: for each of the four decoding paths, the candidates generator of the Sequential Processing Selector Unit (240) evaluates four possibilities for outer-code (3,3) codewords (because it is of rate 1) resulting in a total of 16 possibilities. The selector of Sequential Processing Selector Unit (240) may keep the best eight options (e.g. those that have maximum ranking, such as PM) and the γ memory may be updated by storing outcomes in rows 9-16.

13) Task 832: Re-Encoder Unit (270) applies the inner mapping of code (2,1) and stores the eight results in rows 17-24 of γ memory.

14) Task 834: Re-Encoder Unit (270) applies the inner mapping of code (1,0) and stores the eight results in rows 0-7 of γ memory.

Figure 9:
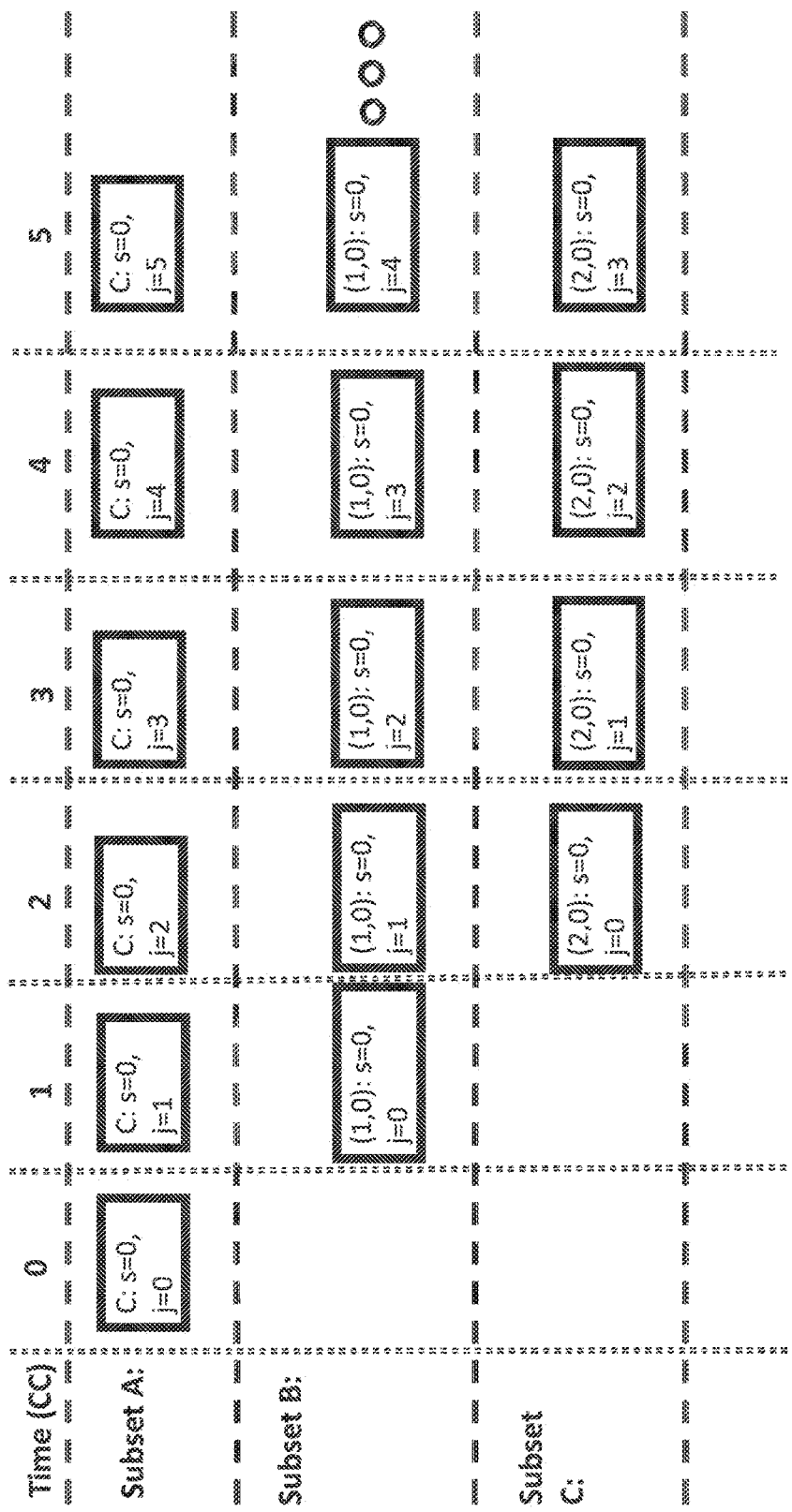
FIG. 9 illustrates a time diagram of pipelined consecutive likelihood preparation operations without early decision.

Attention is now drawn to FIG. 9 which illustrates a time diagram of pipelined consecutive LL preparation operations without early decision. In FIG. 9 and FIG. 10 it is assumed that L=4, $L_{in}$=4 and all the outer-codes of length two bits are of rate 1 (i.e. contain four codewords).

The time diagram illustrates three subsets of processing elements (A, B, and C), with each subset of PEs assigned a different operation. Those PEs may operate in a pipeline, in a manner that the LLs prepared for certain list model j for a certain code $\tilde{C}$ by PE. Set A may be moved to a different set B of PEs for preparation of LLs of the first outer-code of its $\tilde{C}$'s outer code. On the same time A may process list model j+1 of $\tilde{C}$.

The time column of the diagram denotes units of 1 clock-cycle (CC). Each processing element can execute an LL preparation task for a different outer-code (as illustrated). In the illustrated example, the first candidate model reaches Generate & Select stage after 3 CCs, and the last model reaches this stage after 3+$L_{in}$ CCs, where $L_{in}$ is the input list size to the decoder. Note in this case it is assumed that there are 8, 4 and 2 PEs for subsets A, B and C, respectively.

In the time diagram shown in FIG. 9, the different model candidates do not reach Generate & Select stage simultaneously, rather they approach this stage sequentially (starting from the third CC, a new model j is available on every CC).

Attention is now drawn to FIG. 10, which illustrates a time diagram of pipelined processing with early decision, according to some embodiments of the present subject matter. In this example, max list size L=4. In addition to PE subsets A, B and C, the diagram shows the processing of candidates generator and selector (shown as separate units). On clock-cycle 3, the candidates of the first model (j=0) of outer-code (3,0) are generated and on clock-cycle 4 the candidates of the second model (j=1) of (3,0) are generated. In this specific example, the selector decides on the first output model on clock-cycle 5 (after it has received only the candidates of j=0,1) and subsequent to this it outputs a decision every clock-cycle. Those new models are denoted by j'=0, 1, 2, 3. After the first decision it is possible to start LL preparation for s=1 stage of outer-code (2,0) by using subset C of PEs on clock-cycle 6.

Attention is now drawn to FIG. 11, which illustrates exemplary observed latency for three types of sequential list decoders (maximum list size L=8) in decoding four polar codes.

The codes are described by their information payload size in bits (i.e. code dimension), their code rates and codeword length in bits e.g.:
  code #1 as length N=1200 bits, information size=200 bits, and therefore code rate R=200/1200=1/6
  code #2 has code length 1800 bits, information size=600 bits and therefore code rate R=600/1800=1/3

The SCL decoder implements the algorithm suggested by Ido Tal and Alex Vardy where the base outer-code decoding length is 2 bits. The SSCL algorithm (simplified SCL) is an improved implementation of SCL with a base outer-code decoding of length 4 bits, such that each model in the base decoding of that outer-code may generate at most 4 candidates. Furthermore it includes additional speedup techniques such as skipping on frozen blocks and efficient implementation of rate 1 outer-codes.

Both the SCL decoder and the SSCL decoder implement a method similar to the prior art method described above, with reference to FIGS. 4-5. SSCL with Sequential Processing Selector is the same as the SSCL decoder—with the difference that a sequential processing selector (i.e. a non-limiting embodiment of the early decision method) is employed for processing outer-code block lengths of 32 bits. The latencies are given for two different parallelism levels i.e. NPE=32 and 64. It is assumed that the clock frequency of the decoder is 1 GHz.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore, described without departing from its scope, defined in and by the appended claims.

The invention claimed is:

1. A method of sequential list decoding of a codeword of an error correction code, the method provided by a decoder comprising a plurality of processors, the method comprising:
   a) obtaining, by the decoder, an ordered sequence of constituent codes usable for sequential decoding of the error correction code;
   b) executing by a first processor of the plurality of processors a task of decoding a first constituent code, the executing comprising:
      i) generating a set of one or more decoding candidate words (DCWs) usable to be selected for decoding a subsequent constituent code, each DCW associated with a respectively generated ranking, wherein the DCWs are candidate codewords or candidate information words;
      ii) for the first constituent code, upon occurrence of a sufficiency criterion, and prior to completion by the first processor of the generating all DCWs and respectively associated rankings, selecting, in accordance with a selection criterion, at least one DCW, thereby giving rise to one or more selected DCWs;
   c) executing, by a second processor of the plurality of processors, a task of decoding a subsequent constituent code, the executing comprising processing data derived from the one or more selected DCWs to generate data usable for decoding a next subsequent constituent code.

2. The method of claim 1, further comprising repeating the operations b) and c) until a completion criterion is met.

3. The method of claim 1, wherein the first processor and the second processor are the same processor.

4. The method of claim 1, wherein the second processor executes at least part of the task of decoding of the second subsequent constituent code concurrently with the executing the task of decoding of the first constituent code by the first processor.

5. The method of claim 2, wherein the completion criterion occurs when all DCWs and respectively associated rankings have been generated.

6. The method of claim 1, wherein the sufficiency criterion occurs when a count of generated DCWs and rankings thereof meets a generated DCW threshold.

7. The method of claim 1, wherein the sufficiency criterion occurs when a count of generated DCWs with associated rankings that meet a ranking threshold meets a high ranking DCW count threshold.

8. The method of claim 1, wherein the sufficiency criterion occurs when a count of input models for which all DCWs and rankings thereof have been generated meets an input model threshold.

9. The method of claim 1, wherein a ranking is associated with an input model, and wherein the generating of DCWs with respectively associated rankings from input models is ordered according to the rankings associated with the input models.

10. The method of claim 1, wherein the selecting comprises utilizing a threshold number of DCWs to be selected and, upon the generating of a DCW with a ranking exceeding the ranking of a given number of already selected DCWs, selecting a number of DCWs larger than the threshold.

11. The method of claim 1, wherein the data derived from the one or more selected DCWs comprises a re-encoded candidate information word.

12. The method of claim 1, wherein the data derived from the one or more selected DCWs comprises a candidate codeword.

13. The method of claim 1, wherein the executing by a second processor of the plurality of processors comprises, upon occurrence of a cancellation criterion, cancelling processing of data derived from a given selected DCW.

14. The method of claim 13, wherein the cancellation criterion occurs when a count of DCWs with an associated ranking exceeding the ranking of the given selected DCW meets a DCW cancellation threshold.

15. The method of claim 1, wherein the ranking associated with a DCW is indicative of a path metric of the DCW.

16. The method of claim 1, wherein the selection criterion occurs when a DCW has an associated ranking meeting a ranking selection threshold.

17. The method of claim 1, wherein the selection criterion occurs when a DCW derived from a given input model has an associated ranking meeting an input model ranking selection threshold.

18. The method of claim 1, wherein the selection criterion occurs when a DCW has the highest associated ranking of all DCWs derived from a given input model.

19. The method of claim 1, wherein the selection criterion occurs when a DCW has the highest ranking of all DCWs derived from input models from which no DCW has yet been selected.

20. The method of claim 1, wherein the error correction code is a generalized concatenated code.

21. The method of claim 20, wherein the ordered sequence of constituent codes usable for sequential decoding of the error correction code is derived from an unfolded recursion of a layered factor graph of the generalized concatenated code.

22. The method of claim 1, wherein the ordered sequence of constituent codes usable for sequential decoding of the error correction code is derived from a normal factor graph of the error correction code.

23. The method of claim 20, wherein the error correction code is a polar code.

24. The method of claim 1, wherein the data usable for decoding a next subsequent constituent code comprises data indicative of a symbol likelihood estimate.

25. The method of claim 1, additionally comprising:
   d) executing, by a third processor of the plurality of processors, a task of decoding a second subsequent constituent code, the executing comprising processing data derived from DCWs generated by the task of decoding a subsequent constituent code.

26. A decoder configured to perform sequential list decoding of an error correction code, the decoder comprising a memory and a plurality of processors, wherein:
- a first processor of the plurality of processors is configured to obtain an ordered sequence of constituent codes usable for the sequential decoding of the error correction code;
- a second processor of the plurality of processors is configured to execute a task of decoding a first constituent code, the executing comprising:
  - a) generating a set of one or more decoding candidate words (DCWs) usable to be selected for decoding a subsequent constituent code, each DCW associated with a respectively generated ranking;
  - b) for the first constituent code, upon occurrence of a sufficiency criterion, and prior to completion by the first processor of the generating all DCWs and respectively associated rankings, selecting, in accordance with a selection criterion, at least one DCW, thereby giving rise to one or more selected DCWs;
- a third processor of the plurality of processors is configured to execute a task of decoding a subsequent constituent code, the executing comprising processing data derived from the one or more selected DCWs to generate data usable for decoding a next subsequent constituent code.

27. The decoder of claim 26, wherein the first processor, second processor, and third processor are the same processor.

28. A method of sequential list decoding of a codeword of an Arikan polar code, the method provided by a decoder comprising a plurality of processors, the method comprising:
- a) obtaining, by the decoder, an ordered sequence of outer codes according to an unfolded recursion of a layered factor graph of the polar code represented as a generalized concatenated code;
- b) executing, by a first processor of the plurality of processors, a task of decoding a first outer code, the executing comprising:
  - i) generating a set of one or more candidate information words (CIWs) usable to be selected for decoding a subsequent outer code, each CIW associated with a respectively generated path metric;
  - ii) for the first outer code, upon occurrence of a sufficiency criterion, and prior to completion by the first processor of the generating all CIWs and respectively associated path metrics, selecting, in accordance with a selection criterion, at least one CIW, thereby giving rise to one or more selected CIWs;
- c) executing, by a second processor of the plurality of processors, a task of decoding a subsequent outer code, the executing comprising processing data derived from the one or more selected CIWs to calculate symbol likelihoods usable for decoding a next subsequent outer code.

29. The method of claim 28, further comprising repeating the operations b) and c) until a completion criterion is met.

30. The method of claim 28, wherein the task of decoding of the second outer code executes concurrently with the task of decoding of the first outer code.

* * * * *